US010509058B2

United States Patent
Cadugan et al.

(10) Patent No.: US 10,509,058 B2
(45) Date of Patent: Dec. 17, 2019

(54) CURRENT SENSOR USING MODULATION OF OR CHANGE OF SENSITIVITY OF MAGNETORESISTANCE ELEMENTS

(71) Applicant: Allegro MicroSystems, LLC, Manchester, NH (US)

(72) Inventors: Bryan Cadugan, Bedford, NH (US); Rémy Lassalle-Balier, Bures sur Yvette (FR); Alexander Latham, Harvard, MA (US); Paolo Campiglio, Arcueil (FR); Noémie Belin, Villejuif (FR)

(73) Assignee: Allegro MicroSystems, LLC, Manchester, NH (US)

( * ) Notice: Subject to any disclaimer, the term of this patent is extended or adjusted under 35 U.S.C. 154(b) by 106 days.

(21) Appl. No.: 15/869,620

(22) Filed: Jan. 12, 2018

(65) Prior Publication Data

US 2019/0219616 A1    Jul. 18, 2019

(51) Int. Cl.
*G01R 15/20* (2006.01)
*G01R 33/09* (2006.01)
*G01R 17/00* (2006.01)
*G01R 19/00* (2006.01)

(52) U.S. Cl.
CPC ........... *G01R 15/205* (2013.01); *G01R 17/00* (2013.01); *G01R 19/0092* (2013.01); *G01R 33/091* (2013.01); *G01R 33/098* (2013.01)

(58) Field of Classification Search
CPC .... G01R 15/205; G01R 15/20; G01R 33/091; G01R 33/098
See application file for complete search history.

(56) References Cited

U.S. PATENT DOCUMENTS

| 7,259,545 | B2 | 8/2007 | Stauth et al. | |
|---|---|---|---|---|
| 8,269,491 | B2 | 9/2012 | Cummings et al. | |
| 2008/0258721 | A1* | 10/2008 | Guo | B82Y 25/00 324/252 |
| 2009/0237075 | A1* | 9/2009 | Koss | G01R 33/098 324/252 |
| 2010/0277971 | A1* | 11/2010 | Slaughter | G11C 11/161 365/158 |
| 2015/0022196 | A1* | 1/2015 | Hebiguchi | G01R 15/207 324/244 |
| 2017/0314969 | A1* | 11/2017 | Ausserlechner | G01D 5/147 |

OTHER PUBLICATIONS

Allegro MicroSystems, LLC Datasheet,Dec. 1, 2017, :ACS70331 High Sensitivity, 1 MHz, GMR-Based Current Sensor IC in Space-Saving Low Resistance QFN package; 22 pages.
U.S. Appl. No. 15/895,418, filed Feb. 13, 2018, Bryan Cadugan, et al.

* cited by examiner

*Primary Examiner* — Dominic E Hawkins
(74) *Attorney, Agent, or Firm* — Daly, Crowley, Mofford & Durkee, LLP

(57) ABSTRACT

A current sensor can indirectly measure a sensed current by directly measuring static perturbing AC magnetic fields with magnetoresistance elements, the perturbing magnetic fields generated by perturbing coils. The sensed current can be indirectly measured by modulating or changing sensitivities of the magnetoresistance elements in a way that is directly related to the sensed current.

21 Claims, 12 Drawing Sheets

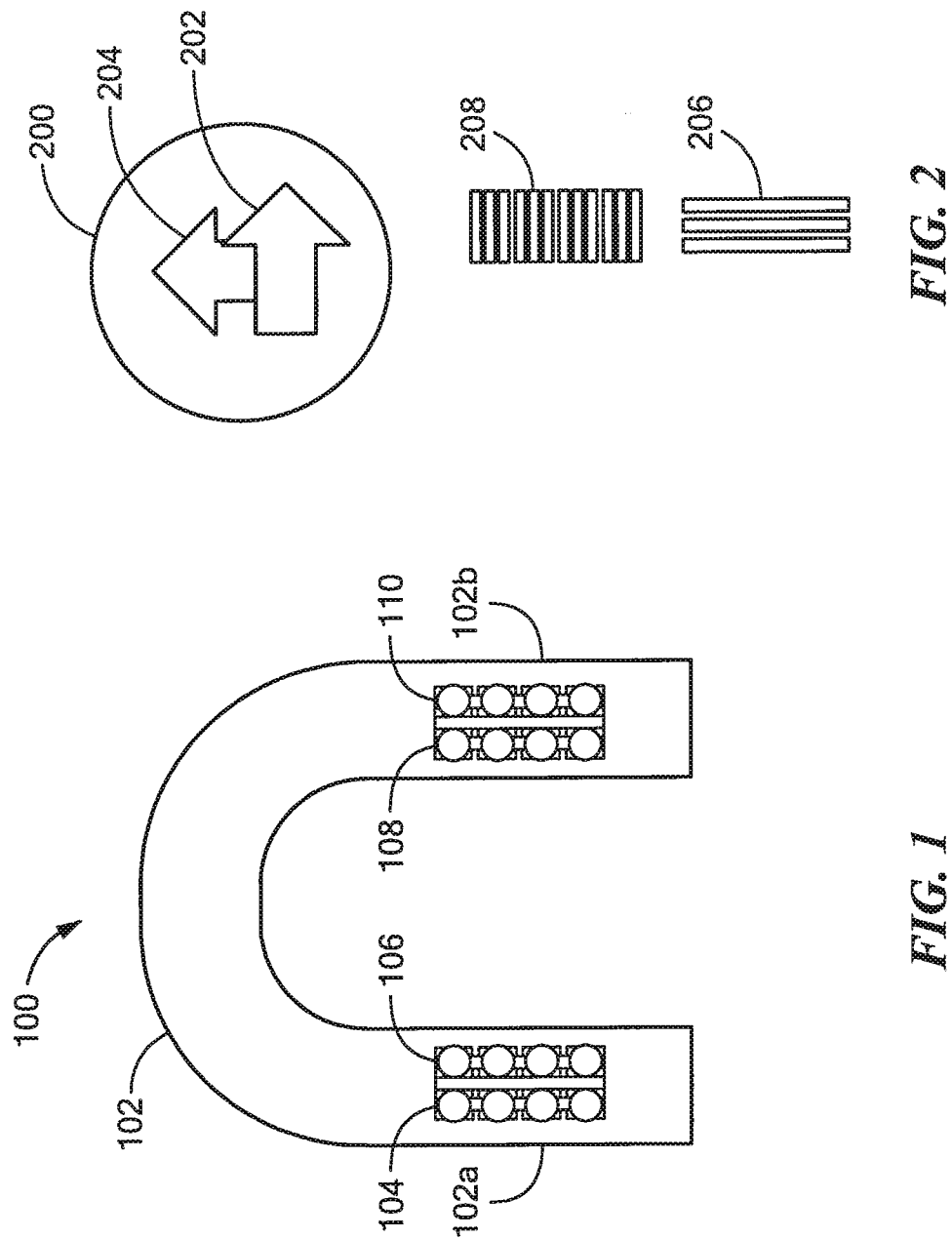

| | | | | |
|---|---|---|---|---|
| Cap | | Ta | 326 | Cap |
| Pinning | ⇄ | PtMn | 324 | Antiferromagnetic |
| Pinned (SAF) | ← | CoFe | 322 | Ferromagnetic |
| | | Ru | 320 | Nonmagnetic |
| | → | CoFe | 318 | Ferromagnetic |
| Spacer | | Spacer (Cu) | 316 | Nonmagnetic |
| Free | ⊙ | CoFe | 314 | Ferromagnetic |
| | ⊙ | NiFe | 312 | Ferromagnetic |
| Spacer | | Ru | 310 | Nonmagnetic |
| Pinned | ⊗ | CoFe | 308 | Ferromagnetic |
| Pinning | ⊗ | PtMn or IrMn | 306 | Antiferromagnetic |
| Seed | | Ru | 304 | Nonmagnetic |

| | | | | |
|---|---|---|---|---|
| Cap | | Ta | 326 | Cap |
| Pinning | ⇄ | PtMn | 324 | Antiferromagnetic |
| Pinned (SAF) | ← | CoFe | 322 | Ferromagnetic |
| | | Ru | 320 | Nonmagnetic |
| | → | CoFeB | 352 | Ferromagnetic |
| Insulator | | MgO | 354 | Nonmagnetic |
| Free | ⊙ | CoFeB | 356 | Ferromagnetic |
| Spacer | | Ru | 310 | Nonmagnetic |
| Pinned | ⊗ | CoFe | 308 | Ferromagnetic |
| Pinning | ⊗ | PtMn or IrMn | 306 | Antiferromagnetic |
| Seed | | CuN | 358 | Nonmagnetic |

CURRENT SENSOR USING MODULATION OF OR CHANGE OF SENSITIVITY OF MAGNETORESISTANCE ELEMENTS

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to current sensors and, more particularly, to current sensors that use modulation of or change of sensitivity of giant magnetoresistance (GMR) elements or tunnel magnetoresistance (TMR) elements.

BACKGROUND

As used herein, the term "magnetic field sensing element" is used to describe a variety of electronic elements that can sense a magnetic field. One such magnetic field sensing element is a magnetoresistance (MR) element. The magnetoresistance element has a resistance that changes in relation to a magnetic field experienced by the magnetoresistance element.

As is known, there are different types of magnetoresistance elements, for example, a semiconductor magnetoresistance element such as Indium Antimonide (InSb), a giant magnetoresistance (GMR) element, an anisotropic magnetoresistance element (AMR), and a tunneling magnetoresistance (TMR) element, also called a magnetic tunnel junction (MTJ) element.

Of these magnetoresistance elements, the GMR and the TMR elements operate with spin electronics (i.e., electron spins) where the resistance is related to the magnetic orientation of different magnetic layers separated by nonmagnetic layers. In spin valve configurations, the resistance is related to an angular direction of a magnetization in a so-called "free-layer" relative to another layer so-called "reference layer." The free layer and the reference layer are described more fully below.

The magnetoresistances element may be used as a single element or, alternatively, may be used as two or more magnetoresistance elements arranged in various configurations, e.g., a half bridge or full (Wheatstone) bridge.

As used herein, the term "magnetic field sensor" is used to describe a circuit that uses one or more magnetic field sensing elements, generally in combination with other circuits. In a typical magnetic field sensor, the magnetic field sensing element and the other circuits can be integrated upon a common substrate, for example, a semiconductor substrate. In some embodiments, the magnetic field sensor can also include a lead frame and packaging.

Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

Various parameters characterize the performance of magnetic field sensors and magnetic field sensing elements. With regard to magnetic field sensing elements, the parameters include sensitivity, which is the change in the output signal of a magnetic field sensing element in response to a magnetic field, and linearity, which is the degree to which the output signal of a magnetic field sensor varies linearly (i.e., in direct proportion) to the magnetic field. The parameters also include offset, which describes and output from the magnetic field sensing element that is not indicative of zero magnetic field when the magnetic field sensor experiences a zero magnetic field.

GMR and TMR elements are known to have a relatively high sensitivity, compared, for example, to Hall effect elements. Thus, a current sensor that uses GMR or TMR elements can sense smaller currents than can a current sensor that uses Hall effect elements.

Conventional current sensors are also known to be undesirably responsive to external stray magnetic fields.

TMR elements are known to have a higher sensitivity than GMR elements, but at the expense of higher noise at low frequencies.

Also, it is known that some GMR and TMR elements tend to have an undesirable offset voltage, the offset voltage sensitivity changing with temperature. Also, it is known that some GMR and TMR elements tend to change behavior, e.g., offset voltage, after high temperature operation or storage. The offset voltage and changes of offset voltage can cause a current sensor that uses a GMR or TMR element to indicate a wrong current.

Thus, it would be desirable to provide a current sensor that uses GMR or TMR elements, which provides a reduced effect of offset voltages, provides a reduced effect of changes of offset voltage, which provides a reduced impact of external stray magnetic fields, and which can effectively use TMR elements to obtain a higher sensitivity to currents.

SUMMARY

The present invention provides a current sensor that uses GMR or TMR elements, and which provides a reduced effect of offset voltages, provides a reduced effect of changes of offset voltage, which provides a reduced impact of external stray magnetic fields, and which can effectively use TMR elements to obtain a higher sensitivity to currents.

In accordance with an example useful for understanding an aspect of the present invention, a magnetic field sensor can include a first magnetoresistance element having a first maximum response axis and having a first pinning layer with a first magnetic direction perpendicular to the first maximum response axis. The magnetic field sensor can also include a second magnetoresistance element having a second maximum response axis parallel to the first maximum response axis and having a second pinning layer with a second magnetic direction perpendicular to the second maximum response axis. The magnetic field sensor can also include a first magnetic field generator disposed proximate to the first magnetoresistance element, the first magnetic field generator configured to generate a first AC magnetic field experienced by the first magnetoresistance element and parallel to the first maximum response axis. The magnetic field sensor can also include a second magnetic field generator disposed proximate to the second magnetoresistance element, the second magnetic field generator configured to generate a second AC magnetic field experienced by the second magnetoresistance element and parallel to the second maximum response axis. The magnetic field sensor can be responsive to a sensed current passing through a current conductor. The current conductor can include a first current conductor portion disposed proximate to the first magnetoresistance element. The current conductor can also include a second current conductor portion disposed proximate to the second magnetoresistance element. The first current conductor portion can be configured to generate a first current conductor magnetic field experienced by the first magnetoresistance element in response to the sensed current passing through the current conductor. The second current conductor portion can be configured to generate a second current conductor magnetic field experienced by the second magnetoresistance element in response to the sensed current passing through the current conductor. The first current conductor magnetic field can be perpendicular to the first maximum response axis, and the second current conductor magnetic field can be perpendicular to the second maximum response axis.

In accordance with another example useful for understanding another aspect of the present invention, a method of providing a magnetic field sensor can include generating a first AC magnetic field experienced by a first magnetoresistance element and parallel to a first maximum response axis, the first magnetoresistance element having the first maximum response axis and having a first pinning layer with a first magnetic direction perpendicular to the first maximum response axis. The method can also include generating a second AC magnetic field experienced by a second magnetoresistance element and parallel to a second maximum response axis, the second magnetoresistance element having the second maximum response axis parallel to the first maximum response axis and having a second pinning layer with a second magnetic direction perpendicular to the second maximum response axis. The method can also include generating a first current conductor magnetic field experienced by the first magnetoresistance element in response to a sensed current passing through a current conductor. The method can also include generating a second current conductor magnetic field experienced by the second magnetoresistance element in response to the sensed current passing through the current conductor. The first current conductor magnetic field can be perpendicular to the first maximum response axis, and the second current conductor magnetic field can be perpendicular to the second maximum response axis.

In accordance with another example useful for understanding another aspect of the present invention, a magnetic field sensor can include means for generating a first AC magnetic field experienced by a first magnetoresistance element and parallel to a first maximum response axis, the first magnetoresistance element having the first maximum response axis and having a first pinning layer with a first magnetic direction perpendicular to the first maximum response axis. The magnetic field sensor can also include means for generating a second AC magnetic field experienced by a second magnetoresistance element and parallel to a second maximum response axis, the second magnetoresistance element having the second maximum response axis parallel to the first maximum response axis and having a second pinning layer with a second magnetic direction perpendicular to the second maximum response axis. The magnetic field sensor can also include means for generating a first current conductor magnetic field experienced by the first magnetoresistance element in response to a sensed current passing through a current conductor. The magnetic field sensor can also include means for generating a second current conductor magnetic field experienced by the second magnetoresistance element in response to the sensed current passing through the current conductor. The first current conductor magnetic field can be perpendicular to the first maximum response axis, and the second current conductor magnetic field can be perpendicular to the second maximum response axis.

BRIEF DESCRIPTION OF THE DRAWINGS

The foregoing features of the invention, as well as the invention itself may be more fully understood from the following detailed description of the drawings, in which:

FIG. 1 is a block diagram showing four TMR elements, each with a plurality of TMR pillars, proximate to a current conductor;

FIG. 2 is a block diagram showing one TMR pillar, two coils, and magnetic field directions associated with the two coils;

FIG. 3 is a block diagram showing an illustrative GMR element having layers;

FIG. 3A is a block diagram showing an illustrative TMR element having layers;

DETAILED DESCRIPTION

Figure 5:
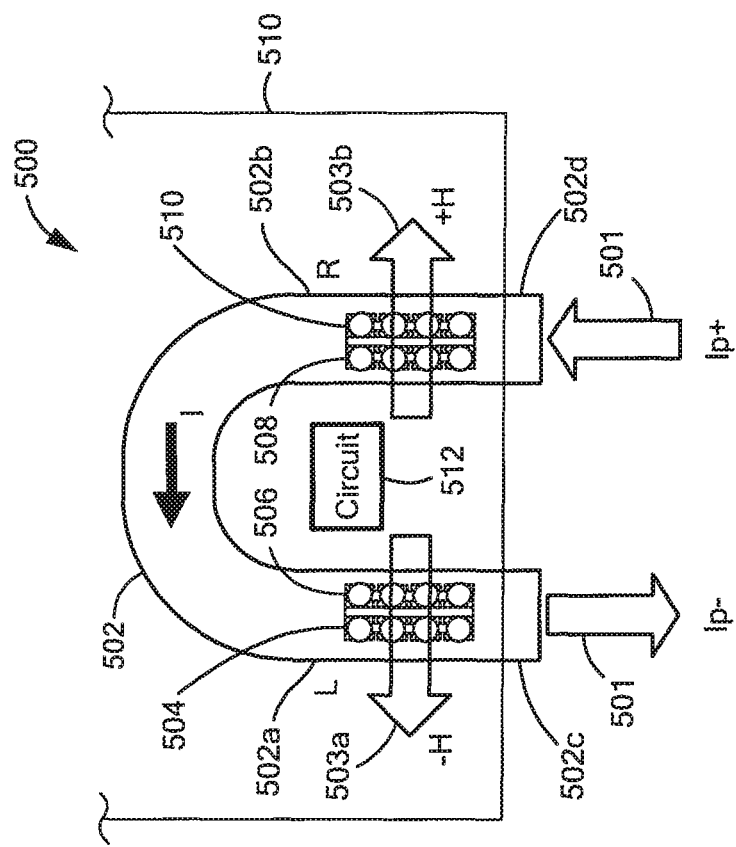
FIG. 5 is a block diagram showing a current sensor having the four TMR elements and the current conductor of FIG. 1, and also showing a substrate proximate to the current conductor.

Before describing the present invention, it should be noted that reference is sometimes made herein to GMR or TMR elements having particular shapes (e.g., yoke shaped or pillar shaped). One of ordinary skill in the art will appreciate, however, that the techniques described herein are applicable to a variety of sizes and shapes.

As used herein, the term "anisotropy" or "anisotropic" refer to a material that has different properties according to direction in the material. A magnetoresistance element can have a particular axis or direction to which the magnetization of a ferromagnetic or ferrimagnetic layer tends to orientate when it does not experience an additional, external, magnetic field. An axial anisotropy can be created by a crystalline effect or by a shape anisotropy, both of which can allow two equivalent directions of magnetic fields. A directional anisotropy can also be created in an adjacent layer, for example, by an antiferromagnetic layer, which allows only a single magnetic field direction along a specific axis in the adjacent layer.

In view of the above, it will be understood that introduction of an anisotropy in a magnetic layer results in forcing the magnetization of the magnetic layer to be parallel to that anisotropy in the absence of an external field. In the case of a GMR or TMR element, a directional anisotropy provides an ability to obtain a coherent rotation of the magnetization in a magnetic layer in response, for example, to an external magnetic field, which has the property of suppressing the hysteresis behavior of the corresponding element.

As described above, as used herein, the term "magnetic field sensing element" is used to describe a variety of different types of electronic elements that can sense a magnetic field. A magnetoresistance element is but one type of magnetic field sensing element.

As is known, there are different types of magnetoresistance elements, for example, a semiconductor magnetoresistance element such as Indium Antimonide (InSb), a giant magnetoresistance (GMR) element, an anisotropic magnetoresistance element (AMR), and a tunneling magnetoresistance (TMR) element, also called a magnetic tunnel junction (MTJ) element.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet, and a magnetic field sensor that senses a magnetic field density of a magnetic field.

The terms "parallel" and "perpendicular" may be used in various contexts herein. It should be understood that the terms parallel and perpendicular do not require exact perpendicularity or exact parallelism, but instead it is intended that normal manufacturing tolerances apply, which tolerances depend upon the context in which the terms are used. In some instances, the term "substantially" is used to modify the terms "parallel" or "perpendicular." In general, use of the terms "substantially" and the term "about" reflect angles that are within manufacturing tolerances, for example, within +/−ten degrees.

Structures and methods described herein apply to both GMR and TMR magnetoresistance elements, but, only TMR elements are used in examples herein. However, it should be appreciated that the same or similar structures and methods can apply to other spin electronics magnetoresistance elements, either now known or later discovered. This includes, in particular, oxide based spin electronics structures.

Referring to FIG. 1, a structure 100, which can be part of a current sensor described below in conjunction with FIG. 5, can include a current conductor 102. The current conductor can be formed as an open loop for which current travels in two different directions. The structure 100 can also include four TMR elements 104, 106, 108, 110. Each TMR element can be comprised of a plurality of so-called "pillars." Four pillars are shown for each one of the TMR elements 104, 106, 108, 110. However, in other embodiments each TMR element can include a different number of pillars, fewer than or greater than four pillars. In some embodiments, each TMR element has approximately thirty pillars.

Referring now to FIG. 2, shown under the TMR elements 104, 106, 108, 110 of FIG. 1, the structure 100 can include four coils, here expanded as two coils 206, 208.

A pillar 200 can be the same as or similar to one of the pillars of the TMR elements 104, 106, 108, 110. It should be understood that the coil 206 can generate a magnetic field with the direction indicated by an arrow 202, and the coil 208 can generate a magnetic field with a direction indicated by an arrow 204. The coils and the magnetic directions are described more fully in figures below.

FIGS. 3 and 3A describe illustrative GMR and TMR elements, respectively. It will be understood that TMR elements are used in various descriptions herein. However, GMR elements can be used in place of the TMR elements.

Referring now to FIG. 3, an illustrative double pinned GMR element 300 can be comprised of a stack of layers 304-326 disposed upon a surface of a substrate 302.

It will be understood that driving current can run across the layers of a GMR stack of layers, i.e., parallel to the surface of the substrate 302. However, in some embodiments, the driving current can run through the layers in a direction perpendicular to the substrate 302. The GMR element 300 can have a maximum response axis that is parallel to the surface of the substrate and that is in a direction 328 perpendicular to zero field magnetic directions of the free layers 312, 314, and also parallel to the field generated by the reference layers, most notable the pinned layer 318.

The GMR element 300 is double pinned, i.e., it has two pinning layers 306, 324. A synthetic antiferromagnet (SAF) pinned layer structure 318, 320, 322 is magnetically coupled to the pinning layer 324. The layers 324, 322, 320, 318 are collectively referring to as reference layers. The single layer pinned layer 308 is magnetically coupled to the pinning layer 306. The layers 306, 308 are collectively referred to as bias layers. At zero external magnetic field, the free layers 312, 314 take on a magnetic alignment parallel to the bias layers 306, 308, with direction (ferromagnetic or antiferromagnetic coupling) determined by thickness and material of the spacer layer 310.

Single pinned arrangements are also possible with one pinning layers and one pinned layer. Advantages of double pinned versus double pinned arrangement are known.

In some embodiments, the single layer pinned layer 308 is replaced by another SAF structure. In still other embodiments, the SAF structure 318, 320, 322 is replaced by a single layer pinned layer.

As described above, in general, the GMR element 300 has a maximum response axis (maximum response to external fields) aligned with the arrow 328, i.e., perpendicular to bias directions experienced by the free layers 312, 314, and parallel to magnetic fields of the reference layers, notably pinned layer 318. Also, in general, it is rotations of the magnetic direction of the free layers 312, 314, caused by external magnetic fields that result in changes of resistance of the GMR stack 300.

A conventional current sensor may directly sense magnetic fields that are in the direction of the arrow 328, which are generated by sensed currents (which are not the above mentioned-currents that drive the GMR element 300). However, it will become apparent from discussion below that, for embodiments herein, the sensed current generates external magnetic fields either into or out of the page, i.e., parallel to magnetic fields of the pinned layers 312, 314 and parallel to magnetic fields of the bias layers 306, 308. Magnetic fields in these directions due to sensed current (i.e., external magnetic fields) tend to increase or decrease a sensitivity of the GMR element 300, sensitivity along the direction 328. Essentially, the external magnetic fields parallel to the magnetic fields of the bias layers 306, 308 tend to add to or subtract from fields in this direction experience by the free layers 312, 314. It will become apparent that the sensitivity shift is sensed by circuits and techniques herein, and thus, it is the sensitivity shift that represents the sensed current.

Referring now to FIG. 3A, in which like elements of FIG. 3 are shown having like reference designations, an illustrative TMR element 350 can have a stack 350 of layers 358, 306-310, 356, 354, 352, 320-326 indicative of one pillar of a multi-pillar TMR element.

It will be understood that a driving current running through the TMR element 350 runs through all of the layers of the stack, running between seed and cap layers 358 and 326, i.e., perpendicular to a surface of the substrate 302. The TMR element 350 can have a maximum response axis that is parallel to the surface of the substrate and that is in the direction 328 perpendicular to zero field magnetic directions of the free layer 356, and also parallel to the bias field generated by the reference layers, most notably in the pinned layer 352.

The TMR element 350 is double pinned, i.e., it has two pinning layers 306, 324. A synthetic antiferromagnet (SAF) pinned layer structure 352, 320, 322 is magnetically coupled to the pinning layer 324. The layers 324, 322, 320, 352 are collectively referring to as reference layers. The single layer pinned layer 308 is magnetically coupled to the pinning layer 306. The layers 306, 308 are collectively referred to as bias layers. With zero external magnetic field, the free layer 356 takes on a magnetic alignment parallel to the bias layers 306, 308, with direction (ferromagnetic or antiferromagnetic coupling) determined by thickness and material of the spacer layer 310.

In some embodiments, the single layer pinned layer 308 is replaced by another SAF structure. In still other embodiments, the SAF structure 352, 320, 322 is replaced by a single layer pinned layer.

As described above, in general, the TMR element 350 has a maximum response axis (maximum response to external fields) aligned with the arrow 328, i.e., perpendicular to bias directions experienced by the free layer 356, and parallel to magnetic fields of the reference layers, notably pinned layers 352. Also, in general, it is rotations of the magnetic direction of the free layer 356 caused by external magnetic fields that result in changes of resistance of the TMR element 350.

A conventional current sensor may directly sense magnetic fields that are in the direction of the arrow 328, which are generated by sensed currents (which are not the above mentioned-currents that drive the TMR element 350). However, it will become apparent from discussion below that, for embodiments herein, the sensed current generates external magnetic fields either into or out of the page, i.e., parallel to magnetic fields of the free layer 356 and parallel to magnetic fields of the bias layers 306, 308. Magnetic fields in these directions due to sensed current (i.e., external magnetic field) tend to increase or decrease a sensitivity of the TMR element 300, sensitivity along the direction 328. Essentially, the external magnetic fields parallel to the magnetic fields of the bias layers 306, 308 tend to add to or subtract from fields in this direction experience by the free layer 356. It will become apparent that the sensitivity shift is sensed by circuits and techniques herein, and thus, it is the sensitivity shift that represents the sensed current.

Figure 4:
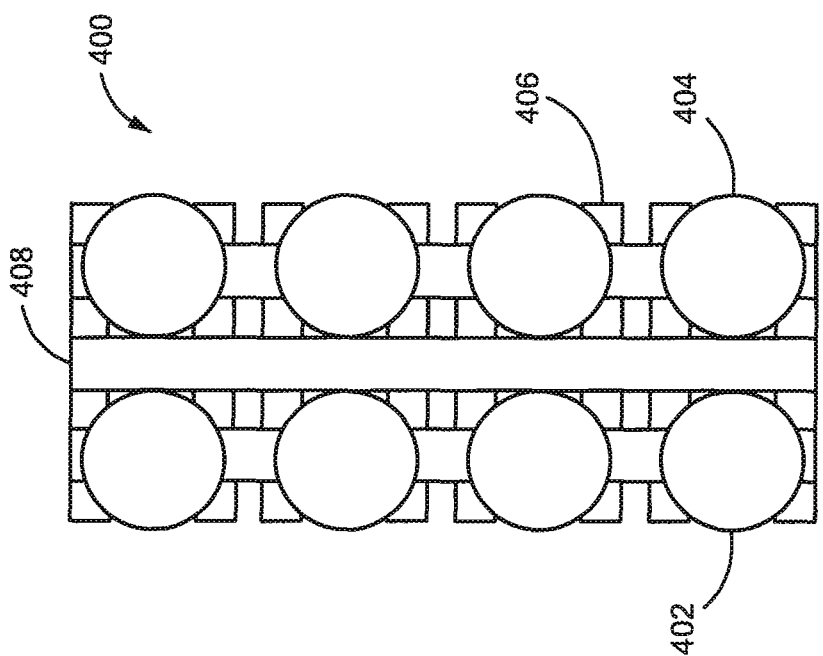
FIG. 4 is a block diagram showing an expanded view of two of the four TMR elements of FIG. 1 and showing positions of the two coils of FIG. 2.

Referring to FIG. 4, illustrative TMR elements 400 include a first TMR element 402 and a second TMR element 404. Each one of the TMR elements includes a respective four TMR pillars that extend upward from a surface of a substrate on which the TMR elements 402, 404 are formed. As described above, a TMR element can have more than four or fewer than four pillars. The TMR elements 400 are the same as TMR elements 104, 106 or TMR elements 108, 110 of FIG. 1, but here shown in expanded form to better show the coils 406, 408, which can be the same as or similar to the coils 208, 206 of FIG. 2.

In non-feedback arrangements, the feedback coils 408 are not formed.

It will be understood that, when an AC current is applied to the perturbing coil 406, a perturbing magnetic field is generated in a direction parallel to the page and oriented between top and bottom on the page. In contrast, when an AC or DC current is applied to the feedback coil 408, a feedback magnetic field is generated in a direction parallel to the page and oriented between right and left on the page.

Referring again briefly to FIG. 3A, the TMR element 350 is shown in side view, but the TMR elements 402, 404 are shown in top view. The TMR element pillars are oriented such that the maximum response axis 328 is parallel to the perturbing magnetic fields generated by the perturbing coil 406, i.e., between right and left on the page of FIG. 3A but between top and bottom on the page of FIG. 4. Accordingly, the TMR element pillars can be oriented such that the maximum response axis 328 is perpendicular to the current conductor (external) magnetic fields generated by the sensed currents 501 of FIG. 5. Also, the TMR element pillars can be oriented such that magnetic directions of the reference layers of the TMR element 350 are perpendicular to the current conductor magnetic fields generated by the sensed currents.

With this orientation of the TMR element pillars, the TMR element pillars are also oriented such that a direction of bias magnetic fields in the bias layers 306, 308 is parallel to a feedback magnetic field generated by the feedback coil 408, i.e., into and out of the page on FIG. 3A, but between right and left on the page of FIG. 4, which is also parallel to, but opposing, sensed magnetic fields generated by the sensed current.

Referring again briefly to FIG. 4, when feedback is used, fields generated by the feedback coil 408 are used to oppose (and are parallel to) fields resulting from sensed current in the current conductor 102 of FIG. 1, which are also parallel to fields in the bias layers 306, 308 of FIG. 3A.

From the above, it should be understood that, for a circuit with no feedback and no feedback coils 408, sensed magnetic fields resulting from sensed currents result in sensitivity shifts of the TMR elements 400 and the sensed magnetic fields are not directly sensed. For a circuit with feedback, the feedback coil 408 can generate a feedback magnetic field that fully opposes the sensed magnetic field generated by the sensed currents in a current conductor. The feedback coil arrangement can result in no sensitivity shift at the TMR elements 400. However, current in the feedback coil 408 can be indicative of a sensitivity shift that would have occurred were it not for the feedback arrangement and the feedback coil 408. The current in the feedback coils can be indicative of the sensitivity shift that would have occurred.

Examples of circuits with and without feedback are described in conjunction with figures below. Advantages of feedback arrangements include, but are not limited to, and ability to keep the TMR or GMR element operating at a near zero magnetic field, i.e., within a linear region of a transfer characteristic of the TMR or GMR element. Thus, nonlinearity of the measurement of the sensed magnetic field and sensed current can be greatly reduced versus a non-feedback arrangement.

Advantages of using the sensitivity shifts as that which are sensed by the sensed current and resulting sensed magnetic field are described in conjunction with figures below.

Referring now to FIG. 5, a magnetic field sensor 500 can include four TMR elements 504, 506, 508, 510 disposed upon a substrate 510 along with an electronic circuit 512.

The magnetic field sensor can also include a current conductor 502 through which a sensed current 501, Ip+, Ip– that the magnetic field sensor 500 is operable to measure, can flow. To avoid confusion herein, the sensed current 501 is described herein to be a DC sensed current. However, the same techniques apply to an AC measure current.

As indicated, because the current conductor 502 is an open loop, the current 501 flows in two different directions Ip–, Ip+. The current conductor 502 has two current conductor portions 502a, 502b. Thus, the current 501 results in two different direction magnetic fields represented by arrows 503a, 503b.

It should be understood from discussion above that maximum response axes of the four TMR element 504, 506, 508, 510 are parallel to the long axis of the TMR elements, i.e., between top and bottom of the page, and are all in the same direction. Along this same axis, perturbing magnetic fields generated by perturbing coils, e.g., 406 of FIG. 4, are generated.

Also, the fields in the bias layers e.g., 306, 308 of FIG. 3A, are aligned between right and left on the page of FIG. 5 and all have the same direction. Thus, the sensed current magnetic fields 503a, 503b are aligned with the bias magnetic fields (between right and left) and not with the maximum response axis (between top and bottom). Since the sensed magnetic fields 503a, 503b are in opposite directions, sensitivity of two of the TMR elements, e.g., 504, 506, moves in one direction, e.g., increases, and sensitivity of the other two TMR elements, e.g., 508, 510, moves in the other direction, e.g., decreases.

In some embodiments, the current conductor 502 can be part of a lead frame of the magnetic field sensor 500, which can terminate at two of a plurality of leads in the lead frame. In other embodiments, the current conductor 502 is not part of the magnetic field sensor, but is instead a separate conductor, for example, a current conductor on a circuit board to which the magnetic field sensor 500 is mounted.

The TMR elements 504, 506 are labeled as left, L, and the TMR elements 508, 510 are labeled right, R. The left and right designations are arbitrary, and are used to indicate that the TMR elements 504, 506 experience the magnetic field 503a that is in a different direction from the magnetic field 503b experience by the TMR elements 508, 510. However, for convenience, left and right also indicate left and right sides of FIG. 5. The different directions result from the two different directions in which the sensed current 501 flows in the current conductor 502.

While the four TMR elements 504, 506, 508, 510 are shown, in other embodiments, there can be two TMR elements, one disposed on the left and one disposed on the right. In other embodiments, there can be more than four TMR elements, with half on the left and half on the right.

Figure 6:
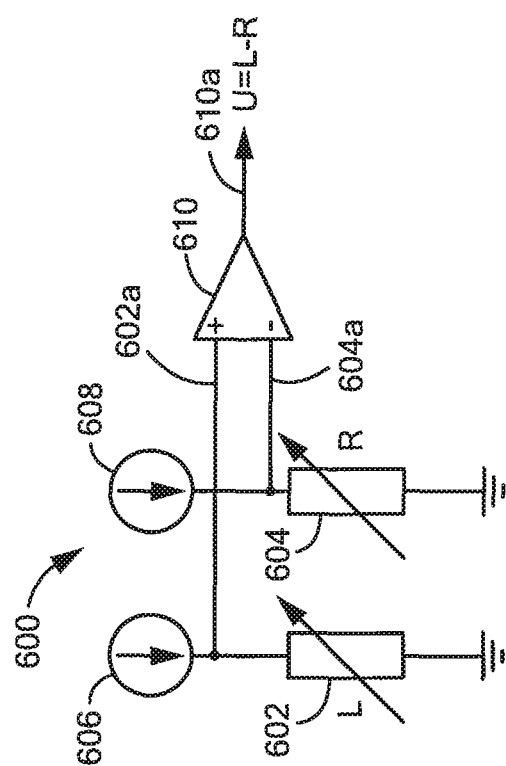
FIG. 6 is a schematic diagram showing two TMR elements or two GMR elements coupled to a differential amplifier to generate a difference signal.

Referring now to FIG. 6, an electronic circuit 600, used in illustrative magnetic field sensors described in conjunction with figures below, can include first and second magnetoresistance elements 602, 604, e.g., TMR elements. The magnetoresistance element 602 can receive a driving current from a current source 606. The magnetoresistance element 604 can receive a driving current from a current source 608.

Voltages 602a, 604a are generated by the first and second magnetoresistance elements 602, 604, respectively, which are responsive to magnetic fields.

A differential amplifier 610 is coupled to the first and second magnetoresistance elements 602, 604. The differential amplifier 610 is operable to generate a voltage 610a that is a difference (U=L−R) of the voltages 602a, 604a. Reasons for the difference are described in conjunction with figures below.

It should be understood that circuits described in conjunction with figures below can instead generate a difference R−L, with minor modifications.

Figure 7:
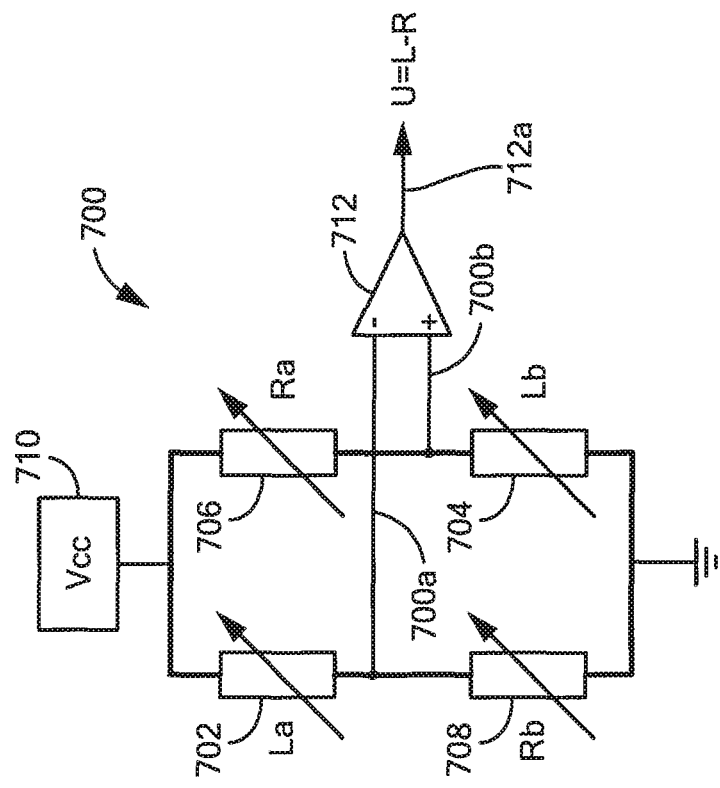
FIG. 7 is a schematic diagram showing four TMR elements or four GMR elements coupled in a bridge arrangement to generate a difference signal.

Referring now to FIG. 7, an electronic circuit 700, used in illustrative magnetic field sensors described in conjunction with figures below, can include first, second, third, and fourth magnetoresistance elements 702, 704, 706, 708, e.g., TMR elements arranged in a full bridge arrangement. The full bridge arrangement can be coupled between a voltage source 710 and a reference voltage, e.g., a ground voltage.

Voltages 700a, 700b are generated by the full bridge, both of which are responsive to magnetic fields. A difference between the voltages 700a, 700b is automatically generated by the full bridge arrangement.

A differential amplifier 712 can be coupled to the full bridge arrangement. The differential amplifier 712 is operable to generate a difference signal 712a that is also a difference of the voltages 700a, 700b. Reasons for the difference are described in conjunction with figures below.

Figure 8:
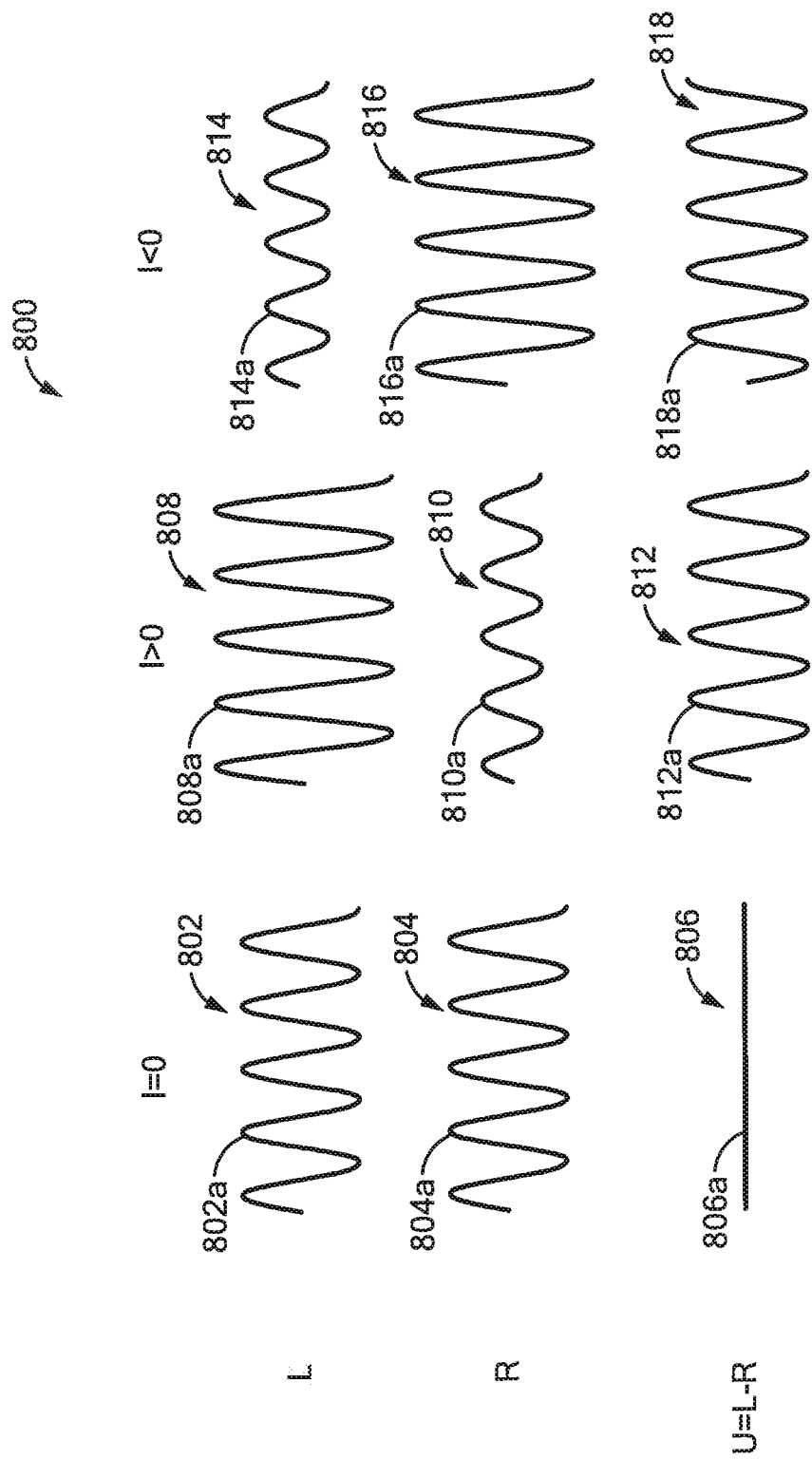
FIG. 8 is a graph showing a variety of signals that can be generated by a current sensor having the arrangement of FIGS. 5-7.

Referring now to FIG. 8, graphs 800 have vertical ranges in amplitude, for example, volts in arbitrary units, and horizontal ranges in time in arbitrary units.

For clarity, the graphs 800 use sensed currents, e.g., the sensed current 501 of FIG. 5, as being DC currents, in particular, I=0, I>0, and I<0. However, here and in circuits described below, it will be understood that the sensed currents can be AC currents.

Graph 802 is indicative of an AC signal 802a generated by the left magnetoresistance element(s), e.g., one of, or both of, the magnetoresistance elements 504, 506 of FIG. 5, when the sensed current, e.g., 501 of FIG. 5, is zero. The AC part of the signal is a result of the perturbing magnetic field described above in conjunction with FIG. 4, generated by the coil 406, which, as described above, can be aligned with a maximum response axis of the left magnetoresistance element(s). The perturbing magnetic field can have a constant amplitude. In some embodiments, the perturbing magnetic field, and the resulting AC signal 802a can have a high frequency, e.g., one megaHertz.

Graph 804 is indicative of an AC signal 804a generated by the right magnetoresistance element(s), e.g., one of or both of the magnetoresistance elements 508, 510 of FIG. 5, when the sensed current, e.g., 501 of FIG. 5, is zero. The AC part of the signal is a result of the perturbing magnetic field also described above in conjunction with FIG. 4, generated by the coil 406, which, as described above, can be aligned with a maximum response axis of the right magnetoresistance element(s).

Graph 806 shows a signal 806a indicative of a difference between the AC signals 802a, 804a. Thus, for a zero sensed current, I, the difference is the signal 806a with an AC amplitude of zero.

Graph 808 is indicative of an AC signal 808a generated by the left magnetoresistance element(s), e.g., one of or both of the magnetoresistance elements 504, 506 of FIG. 5, in response to the perturbing magnetic field(s) generated by the perturbing coils(s), when the sensed current, e.g., 501 of FIG. 5, is greater than zero. The AC part of the signal 808a is a result of the perturbing magnetic field described above in conjunction with FIG. 4, generated by perturbing coils proximate to the left magnetoresistance element(s), e.g., 406, which, as described above, can be parallel to a maximum response axis of the left magnetoresistance element(s). The signal 808a is greater in amplitude than the signal 802a due to an effect of the magnetic field generated by the non-zero sensed current, e.g., the magnetic field 503a generated by the measure current 501 of FIG. 5.

As described above in conjunction with FIG. 4, the magnetic field generated by the sensed current, in a direction parallel to magnetic fields in the bias layers 306, 308 of FIG. 4, has the effect of changing a sensitivity of the left magnetoresistance element(s), here shown to be an increase of sensitivity. Thus, the magnetic field generated by the sensed current 501 has an indirect influence upon the signal 808a.

Graph 810 is indicative of an AC signal 810a generated by the right magnetoresistance element(s), e.g., one of or both of the magnetoresistance elements 508, 510 of FIG. 5, in response to the perturbing magnetic field(s) generated by the perturbing coils(s), when the sensed current, e.g., 501 of FIG. 5, is greater than zero. The AC part of the signal 810a is a result of the perturbing magnetic field described above in conjunction with FIG. 4, generated by perturbing coils proximate to the right magnetoresistance element(s), e.g., 406, which, as described above, can be parallel to a maximum response axis of the right magnetoresistance element(s). The signal 810a is lower in amplitude than the signal 804a due to an effect of the magnetic field generated by the non-zero sensed current, e.g., the magnetic field 503b generated by the sensed current 501 of FIG. 5, and which is in a direction opposite to the magnetic field 503a.

As described above in conjunction with FIG. 4, the magnetic field generated by the sensed current, in a direction parallel to magnetic fields in the bias layers 306, 308 of FIG. 4, has the effect of changing a sensitivity of the left magnetoresistance element(s), here shown to be a decrease of sensitivity. Thus, the magnetic field generated by the sensed current 501 has an indirect influence upon the signal 810a.

Graph 812 shows a signal 812a indicative of a difference between the AC signals 808a, 810a. Thus, for a sensed current, I, greater than zero, the difference is the signal 812a with a non-zero AC amplitude. Amplitude of the signal 812a is indicative of an amplitude of the sensed current 501. Phase of the signal 812a is indicative of a direction of the sensed current 501.

Graph 814 is indicative of an AC signal 814a generated by the left magnetoresistance element(s), e.g., one of or both of the magnetoresistance elements 504, 506 of FIG. 5, in response to the perturbing magnetic field(s) generated by the perturbing coils(s), when the sensed current, e.g., 501 of FIG. 5, is less than zero. The AC part of the signal 814a is a result of the perturbing magnetic field described above in conjunction with FIG. 4, generated by perturbing coils proximate to the left magnetoresistance element(s), e.g., 406, which, as described above, can be parallel to a maximum response axis of the left magnetoresistance element(s). The signal 814a is smaller in amplitude than the signal 802a due to an effect of the magnetic field generated by the non-zero sensed current, e.g., the magnetic field 503a generated by the measure current 501 of FIG. 5, but now reversed versus field 503b.

As described above in conjunction with FIG. 4, the magnetic field generated by the sensed current, in a direction parallel to magnetic fields in the bias layers 306, 308 of FIG. 4. has the effect of changing a sensitivity of the left magnetoresistance element(s), here shown to be a decrease of sensitivity. Thus, the magnetic field generated by the sensed current 501 has an indirect influence upon the signal 814a.

Graph 816 is indicative of an AC signal 816a generated by the right magnetoresistance element(s), e.g., one of or both of the magnetoresistance elements 508, 510 of FIG. 5, in response to the perturbing magnetic field(s) generated by the perturbing coils(s), when the sensed current, e.g., 501 of FIG. 5, is lesser than zero. The AC part of the signal 816a is a result of the perturbing magnetic field described above in conjunction with FIG. 4, generated by perturbing coils proximate to the right magnetoresistance element(s), e.g., 406, which, as described above, can be parallel to a maximum response axis of the right magnetoresistance element(s). The signal 816a is higher in amplitude than the signal 804a due to an effect of the magnetic field generated by the non-zero sensed current, e.g., the magnetic field 503b generated by the sensed current 501 of FIG. 5, and which is in a direction aligned with the magnetic field 503a.

As described above in conjunction with FIG. 4, the magnetic field generated by the sensed current, in a direction parallel to magnetic fields in the bias layers 306, 308 of FIG. 4, has the effect of changing a sensitivity of the left magnetoresistance element(s), here shown to be a decrease of sensitivity. Thus, the magnetic field generated by the sensed current 501 has an indirect influence upon the signal 814a.

Graph 818 shows a signal 818a indicative of a difference between the AC signals 812a, 812b. Thus, for a sensed current, I, less than zero, the difference is the signal 818a with a non-zero AC amplitude. Amplitude of the signal 818a is indicative of an amplitude of the sensed current 501. Phase of the signal 818a is indicative of a direction of the sensed current 501. The signal 818a (and 816a, 814a) is opposite in phase from (one hundred eighty degrees apart from) the signal 812a, which is indicative of the different directions of the sensed current.

As described above, the graphs 800 are indicative of DC sensed magnetic fields, e.g., 503a, 503b of FIG. 5, generated by a DC current, e.g., 501 of FIG. 5. However, the same techniques apply to AC sensed magnetic fields generated by and AC sensed current. To this end, it will be understood that preferably, the AC sensed current has a frequency or bandwidth less than a frequency of the perturbing magnetic fields, e.g., frequency of the signals in the graphs 800. In some embodiments, the frequency or bandwidth of the AC sensed current is less than one half of the frequency of the perturbing magnetic fields. In some embodiments, the frequency or bandwidth of the AC sensed current is less than one fifth or less than one tenth of the frequency of the perturbing magnetic fields.

Figure 9:
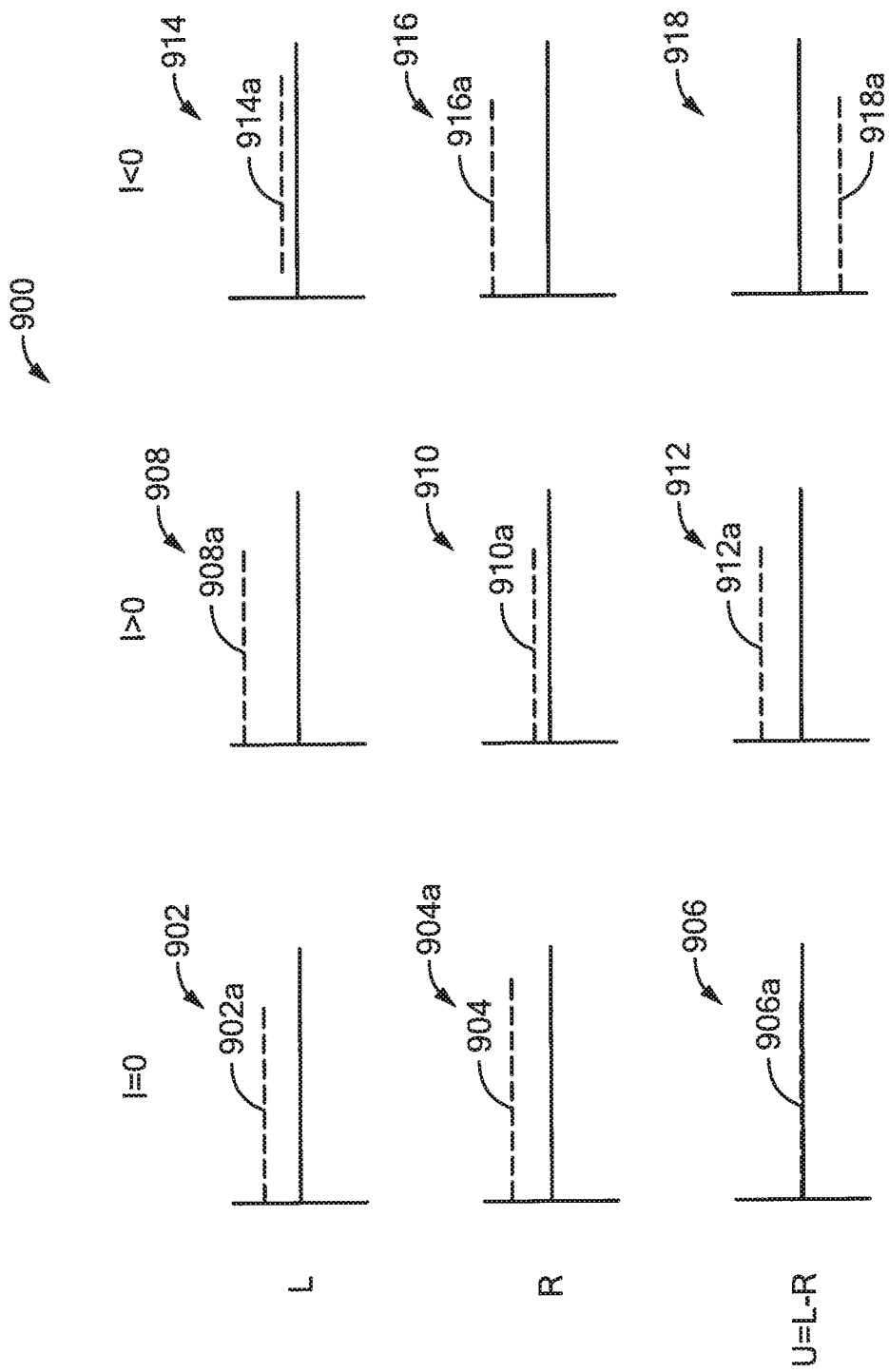
FIG. 9 is a graph showing a variety of signals generated by a current sensor having the arrangement of FIG. 5-7 and having an amplitude detector resulting in amplitudes of the signals of FIG. 8.

Referring now to FIG. 9 and referring back to FIG. 8, graphs 900 show DC signals 902a, 904a, 906a, 908a, 910a, 912a, 914a, 916a, 918a that are indicative of AC amplitudes of the signals 802a, 804a, 806a, 808a, 810a, 812a, 814a, 816a, 818a, respectively. The signal 918a is shown as a negative amplitude, which is indicative of the signal 818a being one hundred eighty degrees out of phase from the other signals. Compare signals 912a and 918a and also signals 812a and 818a. The signal 918a with an opposite sign is an outcome of the signal 918a being a difference of signals 914a and 916a.

Reasons for the signals 902a, 904a, 906a, 908a, 910a, 912a, 914a, 916a, 918a indicative of amplitudes will become apparent in figures below that describe amplitude detecting circuits.

Figure 10:
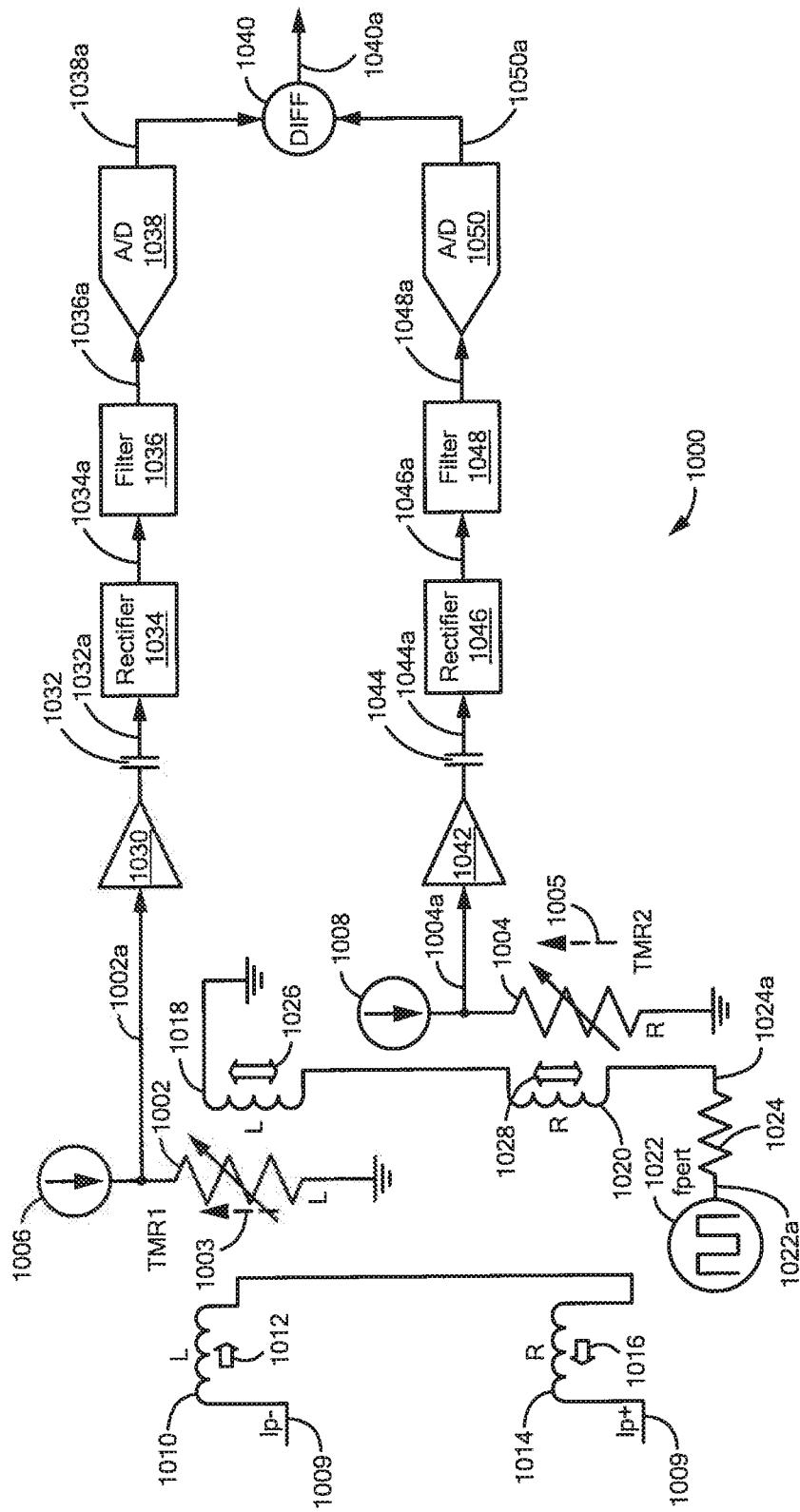
FIG. 10 is a schematic diagram of an illustrative current sensor having two TMR or GMR elements and two amplitude detector circuits and with a non-feedback arrangement.

Referring now to FIG. 10, an illustrative magnetic field sensor 1000 can include first and second magnetoresistance elements 1002, 1004, respectively, which are also designated left, L, and right, R, magnetoresistance elements, which can indicate left and right sides of FIG. 5.

The first magnetoresistance element 1002 can be the same as or similar to the magnetoresistance element 602 of FIG. 6. The second magnetoresistance element 1004 can be the same as or similar to the magnetoresistance element 604 of FIG. 6.

The first magnetoresistance element 1002 is coupled to receive a driving current from current source 1006. The second magnetoresistance element 1004 is coupled to receive a driving current from a current source 1008. A voltage signal 1002a is generated by the first magnetoresistance element 1002. A voltage signal 1004a is generated by the second magnetoresistance element 1004.

The first magnetoresistance element 1002 has a maximum response axis for which the direction is indicated by an arrow 1003. The second magnetoresistance element 1004 has a maximum response axis for which the direction is indicated by an arrow 1005.

A first perturbing coil 1018 is disposed proximate to the first magnetoresistance element 1002. A second perturbing coil 1020 is disposed proximate to the second magnetoresistance element 1004. The first and second perturbing coils 1018, 1020 can be coupled in series.

A clock generator 1022 can be operable to generate a clock voltage signal 1022a coupled to a resistor 1024. A current signal 1024a is generated as an end of the resistor 1024.

In response to the current signal 1024a, the first perturbing coil 1018 generates an AC magnetic field with directions indicated by an arrow 1026. Also in response to the current signal 1024a, the second perturbing coil 1020 generates an AC magnetic field with directions indicated by an arrow 1028. The directions 1026 of magnetic fields generated by the first perturbing coil 1018 are parallel to the maximum response axis 1003 of the first magnetoresistance element 1002. The directions 1028 of magnetic fields generated by the second perturbing coil 1020 are parallel to the maximum response axis 1005 of the second magnetoresistance element 1004. Thus, the first magnetoresistance element 1002 and the second magnetoresistance element 1004 are directly responsive to magnetic fields generated by the first perturbing coil 1018 and by the second and perturbing coil 1020, respectively. Thus, the first and second voltage signals 1002a, 1004a can be AC voltage signals, each with a frequency equal to a frequency of the clock signal 1022a.

The magnetic field sensor 1000 may or may not include a current conductor see, e.g., coils 1010, 1014), for example the current conductor 501 of FIG. 5. In some embodiments, it should be understood from discussion above that the current conductor can be a conductor inside of the magnetic field sensor 1000 and, in other embodiments, the current conductor can be a conductor inside of the magnetic field sensor 1000.

The current conductor is indicated in part by a first sensed current coil 1010 indicative of a first portion of, for example, a left side of, a sensed current conductor, for example, the left side of the sensed current conductor 501 of FIG. 5. The sensed current conductor is also indicated in part by a second sensed current coil 1014 indicative of a second portion of, for example, a right side of, the sensed the current conductor, for example, the right side of the sensed current conductor 501 of FIG. 5. However, it will be understood that the sensed current conductor 501 is not coil. The first and second sensed current coils 1010, 1014 are used merely to clarify that magnetic fields are generated by the sensed current conductor 501.

As described above, a sensed current 501 carried by the sensed current conductor 502 of FIG. 5, i.e., a sensed current 1009 carried by the first and second sensed current coils 1010, 1014, are described herein to be DC currents, merely for clarity. Thus, the first sensed current coil 1010 generates a magnetic field with a first direction indicated by arrow 1012, and the second sensed current coil 1014 generates a magnetic field with a second direction indicated by an arrow 1016. The first and second directions 1012, 1016 are in opposite directions from each other.

For reasons described above in conjunction with FIGS. 4 and 5, the magnetic fields with first and second directions 1012, 1016, respectively, result in opposite direction changes of sensitivity of the first magnetoresistance element 1002 and of the second magnetoresistance element 1004. The changes of sensitivity are represented by the graphs 800 of FIG. 8.

An amplifier 1030 is coupled to receive the first voltage signal 1002a, which, as described above, can be an AC voltage signal like the signals 802a, 808a, 814a of FIG. 8, having an AC frequency equal to a frequency of the clock signal 1022a, and having an amplitude in accordance with an amplitude of the sensed magnetic field having the direction 1012.

Similarly, an amplifier 1042 is coupled to receive the second voltage signal 1004a, which, as described above, can be an AC voltage signal like the signals 804a, 810a, 816a of FIG. 8, having an AC frequency equal to a frequency of the clock signal 1022a, and having an amplitude in accordance with an amplitude of the sensed magnetic field having the direction 1016.

The amplifier 1030 is operable to generate an amplified signal 1030a and the amplifier 1042 is operable to generate and amplified signal 1042a.

The amplified signal 1030a can be AC coupled with a capacitor 1032 and the amplified signal 1042a can be AC coupled with a capacitor 1044, to generate AC coupled signals 1032a, 1042a.

A rectifier 1034 can be coupled to receive the AC coupled signal 1032a and a rectifier 1046 can be coupled to receive the AC coupled signal 1044a. The rectifier 1034 can be operable to generate a rectified signal 1034a and the rectifier 1046 can be operable to generate a rectified signal 1046a. In some embodiments, the rectifiers 1034, 1046 can be active rectifier circuits using feedback that have little or no voltage drop.

A filter 1036 can be coupled to receive the rectified signal 1034a and a filter 1048 can be coupled to receive the rectified signal 1046a. In some embodiments, the filters 1036, 1048 can be low pass filters.

It will be understood that the rectifier 1034 coupled in series with the filter 1036 forms a first amplitude detection circuit. It will also be understood that the rectifier 1046 series with the filter 1048 points a second amplitude detection circuit. Thus, the filter 1036 is operable to generate an amplitude signal 1036a and the filter 1048 is operable to generate an amplitude signal 1048a.

Referring briefly to FIGS. 8 and 9, it should be understood that the amplitude detecting circuits result in signals in a first two rows of graphs 800 turning into signals in a first two rows of graphs 900.

The magnetic field sensor 1000 can also include an analog-to-digital converter 1038 coupled to receive the amplitude signal 1036a and an analog-to-digital converter 1050 to receive the amplitude signal 1048a. The amplitude to digital converter 1038 is operable to generate a converted signal 1038a and the amplitude to digital converter 1050 is off to generate a converted signal 1050a.

The converted signals 1038a, 1050a can be received by a differencing circuit 1040 operable to generate a difference signal 1040a. Values of the difference signal are directly related to values of the measure current 1009.

The magnetic field sensor 1000, which uses the perturbing magnetic fields with directions 1026, 1028 to indirectly measure the sensed current 1009 has advantages over a conventional magnetic field sensor that directly measures the sensed current 1009. For example, because the capacitors 1032, 1044 can block DC portions of signals to generate the AC coupled signals 1032a, 1044a, any undesirable effects that may result for undesirable DC offset voltages generated by the first and second magnetoresistance elements 1002, 1004 can be eliminated. This is an advantage both for GMR and TMR elements.

In addition, though the magnetic field sensor 1000 can use either TMR elements or GMR elements as the first and second magnetoresistance elements 1002, 1004, the magnetic field sensor 1000 is well suited for use of the TMR elements. It is known that TMR elements tend to have higher sensitivities than GMR elements. It is also known that TMR elements tend to have worse electrical noise and worse signal to noise ratios at low frequencies that GMR elements. Because the magnetic field sensor 1000 actually operates with relatively high frequencies generated by the clock signal generator 1022, the TMR elements, which have higher sensitivity that GMR elements, can avoid the higher noise at low frequencies The same advantages apply to all magnetic field sensors described herein.

Figure 11:
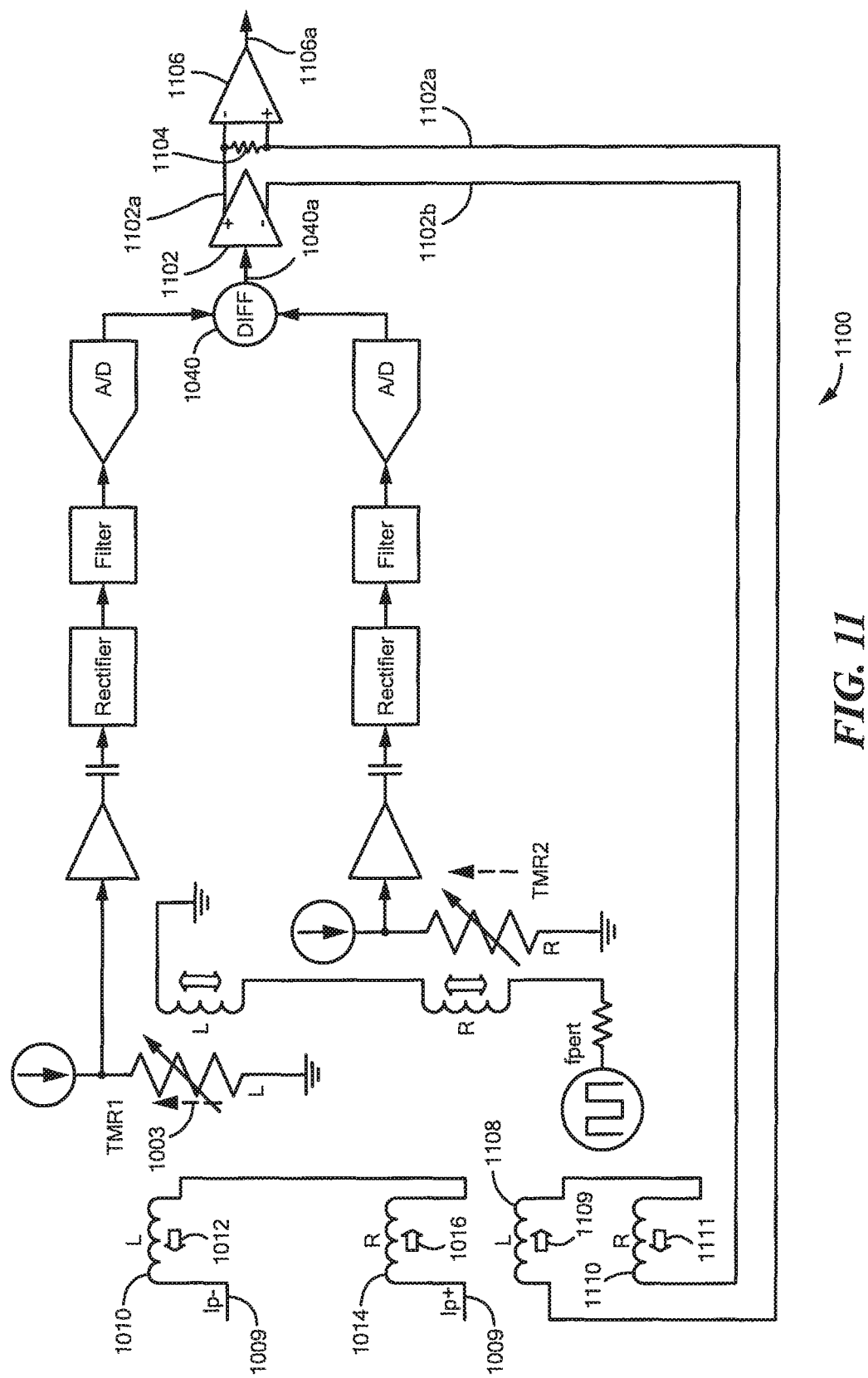
FIG. 11 is a schematic diagram of an illustrative current sensor having two TMR or GMR elements and two amplitude detector circuits and with a feedback arrangement.

It will be understood that the magnetic field sensor 1000 is an open loop magnetic field sensor having no feedback loop from the difference signal 1040a to an earlier point in the magnetic field sensor 1000. FIG. 11 below describes a feedback magnetic field sensor with closed loop feedback.

The amplitude signals 1036a, 1048a are like the signals in the first two rows of the graphs 900 of FIG. 9. The difference signal 1040a is like the signals in the last row of the graph 900 of FIG. 9. Thus, the difference signal 1040a includes information about the amplitude of the sensed current 1009 and the direction of the sensed current 1009. The signal 1040a can be sent outside of the magnetic field sensor 1000 for further processing and interpretation. However, in other embodiments, the signal 1040a can undergo further processing and interpretation by other circuits (not shown) within the magnetic field sensor.

The clock generator 1022 is shown to generate a two state clock signal 1022a. Thus, the current signal 1024a is a two state current signal and the perturbing magnetic fields generated by the first and second perturbing oils 1018, 1020 are two state magnetic fields. Accordingly, the signals 1002a, 1004a are two state signals. This is unlike the AC sinusoid signals of the graphs 100 FIG. 8. However, it will be understood that the same concepts apply to the graphs of FIGS. 8 and 9, but the signals in the graphs 800 of FIG. 8 will be square waves instead of sinusoids.

In some other embodiments, the clocks signal generator 1022 is replaced by a sinewave generator.

The magnetic field sensor 1000, and all magnetic field sensor described herein can provide a variety of advantages over conventional current sensors used to directly sense magnetic fields due to current. For example, DC offsets and offset shifts of the TMR elements has little or no negative influence, because the capacitors 1032, 1044 can block DC signal components.

Effects of any external stray fields are reduced. Effects of stray fields in the direction of the perturbing fields, i.e., in directions perpendicular to directions 503a, 503b of FIG. 5, tend to be canceled by U=L−R calculation. However, stray fields in a direction perpendicular to the perturbing fields, i.e., in directions parallel to directions 503a, 503b of FIG. 5 may be reduced, but by a lesser amount, depending upon a strength of the stray fields. The closed loop mechanism described below in conjunction with FIG. 11 can help to improve the lesser amount of improvement otherwise provided in the effect of stray fields in directions parallel to directions 503a, 503b of FIG. 5.

Referring now to FIG. 11, in which like elements of FIG. 11 are shown having like reference designations, another illustrative magnetic field sensor 1100 can include all of the elements of the magnetic field sensor 1000 of FIG. 10.

The magnetic field sensor 1100 also can include a current driver 1102 coupled to receive the difference signal 1040a and operable to generate differential feedback current signal 1102a, 1102b. A first feedback coil 1108 can be disposed proximate to the first portion of the sensed current conductor 1010. A second feedback coil 1110 can be disposed proximate to the second portion of the sensed current conductor 1014.

The differential feedback current signal 1102a, 1102b can be arranged to generate a first feedback magnetic field that has a direction indicated by an arrow 1109 and to generate a second feedback magnetic field that has a direction indicated by and arrow 1111. The direction 1109 opposes the direction 1012. The direction 1111 opposes the direction 1016. The feedback results in the magnetic fields experienced ty the first and second magnetoresistance elements being approximately zero for all different values of the sensed current 1009.

The magnetic field sensor 1100 can also include a resistor 1104 in series with one side of the differential current signal 1102a, 1102b. A voltage appears across the resistor 1104 with a value in accordance with the differential current signal 1102a, 1102b. A differential amplifier 1106 can be coupled to the resistor 1104. The amplifier 1106 can generate and output signal that is indicative of the sensed current 1009.

Advantages of the magnetic field sensor 1000 are described above in conjunction with FIG. 10. Further advantages are obtained in the feedback arrangement of the magnetic field sensor 1100. In particular, it is known that magnetoresistance elements, both GMR and TMR elements, can suffer from being less than ideally linear throughout their operational range of magnetic fields. With a feedback arrangement, magnetic fields experienced by first and second magnetoresistance elements 1002, 1004 can remain near zero magnetic field, thus, with a feedback arrangement, nonlinearity effects are eliminated or nearly eliminated.

Further illustrative magnetic field sensors are described below. Some further examples of feedback arrangements are also described below. However, should be understood that all of the magnetic field sensors described herein can use a feedback arrangement like that described in conjunction with FIG. 11.

Figure 12:
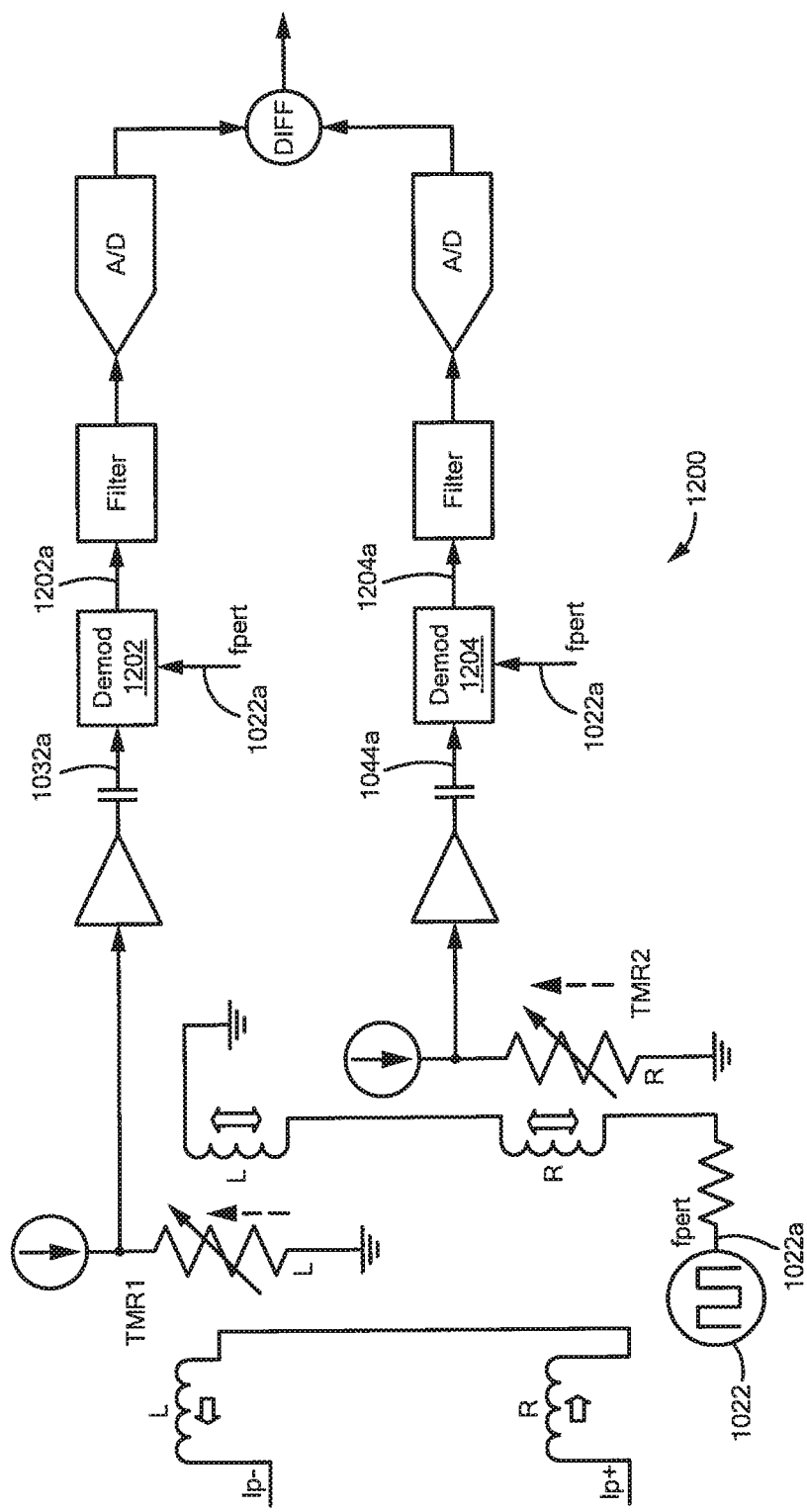
FIG. 12 is a schematic diagram of an illustrative current sensor having two TMR or GMR elements and two different amplitude detector circuits and with a non-feedback arrangement.

Read how to FIG. 12, in which like elements of FIG. 10 are shown having like reference designations, another illustrative magnetic field sensor 1200 can include most of the elements of the magnetic field sensor 1000 of FIG. 10. However, in the magnetic fields sensor 1200, rectifier circuits 1034, 1046 are not used, but are replaced by demodulator circuits 1202, 1204.

The demodulator circuit 1202 is coupled to receive the AC coupled signal 1032 and also coupled to receive the clock signal 1022. The demodulator circuit 1202 can be operable to switch back and forth between the AC coupled signal 1032a and an inverted version of the AC coupled signal 1032a. The clock signal 1022a can be the same frequency as the AC coupled signal 1032a. Thus, the demodulator circuit 1202 can be operable to generate a rectified signal 1202a, which can be the same as or similar to the rectified signal 1034a of FIG. 10.

The demodulator circuit 1204 is similarly coupled as the demodulator circuit 1202 and operates in the same way.

Figure 13:
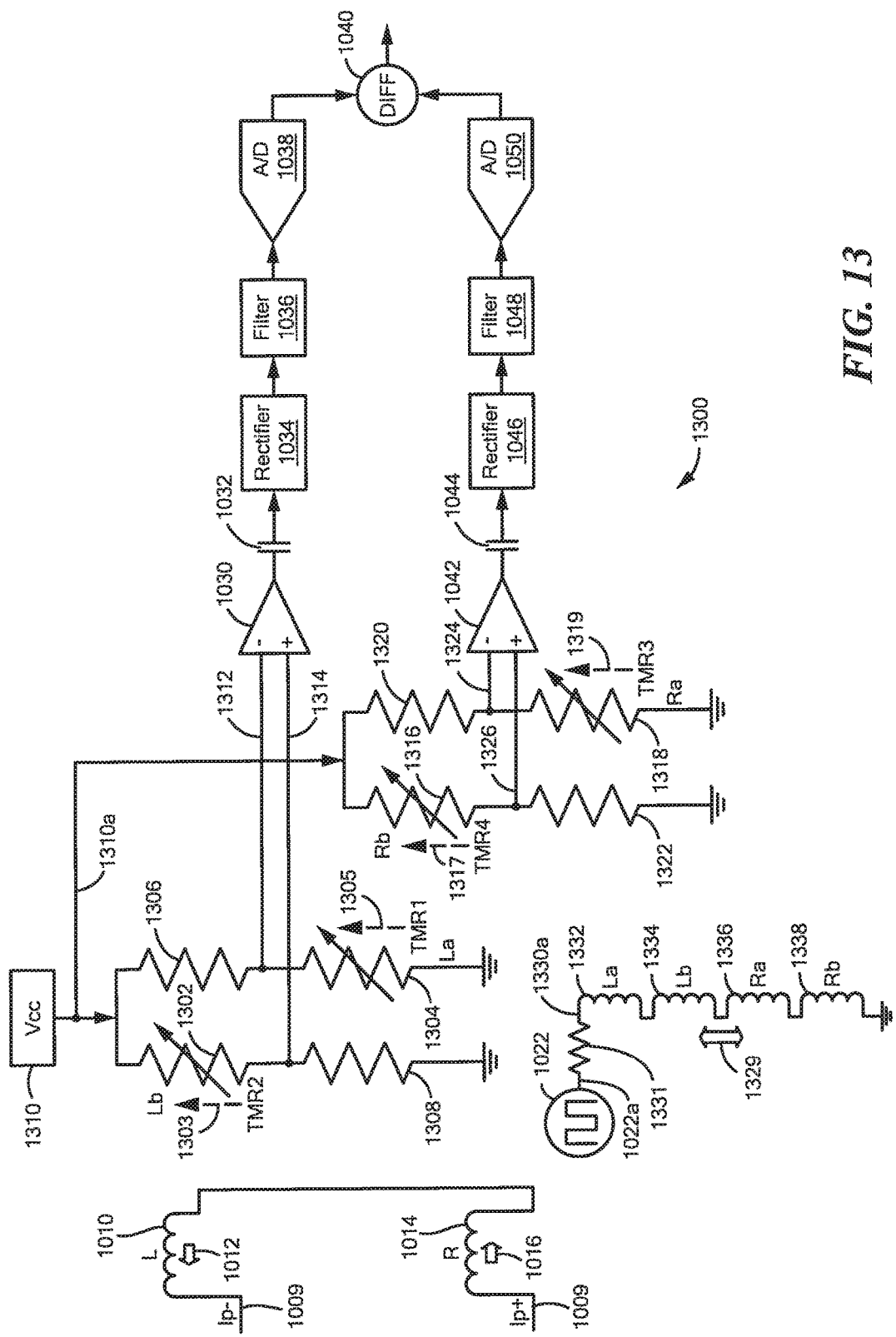
FIG. 13 is a schematic diagram of an illustrative current sensor having four TMR or GMR elements, arranged in two full bridges, and two amplitude detector circuits and with a non-feedback arrangement.

Referring now to FIG. 13, in which like elements of FIG. 10 are shown having like reference designations, another illustrative magnetic field sensor 1300 can include many of the elements of the magnetic field sensor 1000 of FIG. 10. Unlike the first and second magnetoresistance elements 1002, 1004 of FIG. 10, the magnetic field sensor 1300 can include first and second bridge circuits.

The first bridge circuit can include a first magnetoresistance element 1302 and a second magnetoresistance element 1304 coupled together with a first fixed resistor 1306 and a second fixed resistor 1308. The first bridge circuit is operable to generate a first differential bridge signal 1312, 1314.

The second bridge circuit can include a third magnetoresistance element 1316 and a fourth magnetoresistance element 1318 coupled together with a third fixed resistor 1320 and a fourth fixed resistor 1322. The second bridge circuit is operable to generate a second differential bridge signal 1324, 1326.

The first magnetoresistance element 1302 can have maximum response axis of the direction indicated by an arrow 1303. The second magnetoresistance element 1304 can have a maximum response axis of the direction indicated by an arrow 1305. The third magnetoresistance element 1316 can have a maximum response axis of the direction indicated by an arrow 1317. The fourth magnetoresistance element 1318 can have a maximum response axis of the direction indicated by an arrow 1319.

The first and second magnetoresistance elements 1302, 1304 can both be disposed proximate to each other and on the left side, for example, proximate to the left side of the current conductor 502 of FIG. 5. The third and fourth magnetoresistance elements 1316, 1318 can both be disposed proximate to each other and on the right side, for example, proximate to the right side of the current conductor 502 of FIG. 5.

The first sensed current conductor 1010, i.e., the left side of the current conductor 502 of FIG. 5, can be disposed proximate to the first and second magnetoresistance elements 1302, 1304. The second sensed current conductor 1014, i.e., the right side of the current conductor 502 of FIG. 5, can be disposed proximate to the third and fourth magnetoresistance elements 1316, 1318.

Also unlike the first and second perturbing coils 1018, 1020 of FIG. 10, the magnetic field sensor 1300 can include first, second, third, and fourth perturbing coils 1332, 1334, 1336, 1338, respectively. The first perturbing coil 1332 can beast disposed proximate to the first magnetoresistance element 1302. The second perturbing coil 1334 can be disposed proximate to the second magnetoresistance element 1304. The third perturbing coil 1336 can beast disposed proximate to the third magnetoresistance element 1316. The fourth perturbing coil 1338 can be disposed proximate to the fourth magnetoresistance element 1318.

The first, second, third, and fourth perturbing coils 1332, 1334, 1336, 1338 can each generate AC magnetic fields with directions indicated by an arrow 1329. The directions indicated by the arrow 1329 are parallel to the maximum response axes 1303, 1305, 1317, 1319.

The magnetic field sensor 1300 can operate in much the same way as that described above for the magnetic field sensor 1000 of FIG. 10. Therefore, operational the magnetic field sensor 1300 is not described in detail herein.

Figure 14:
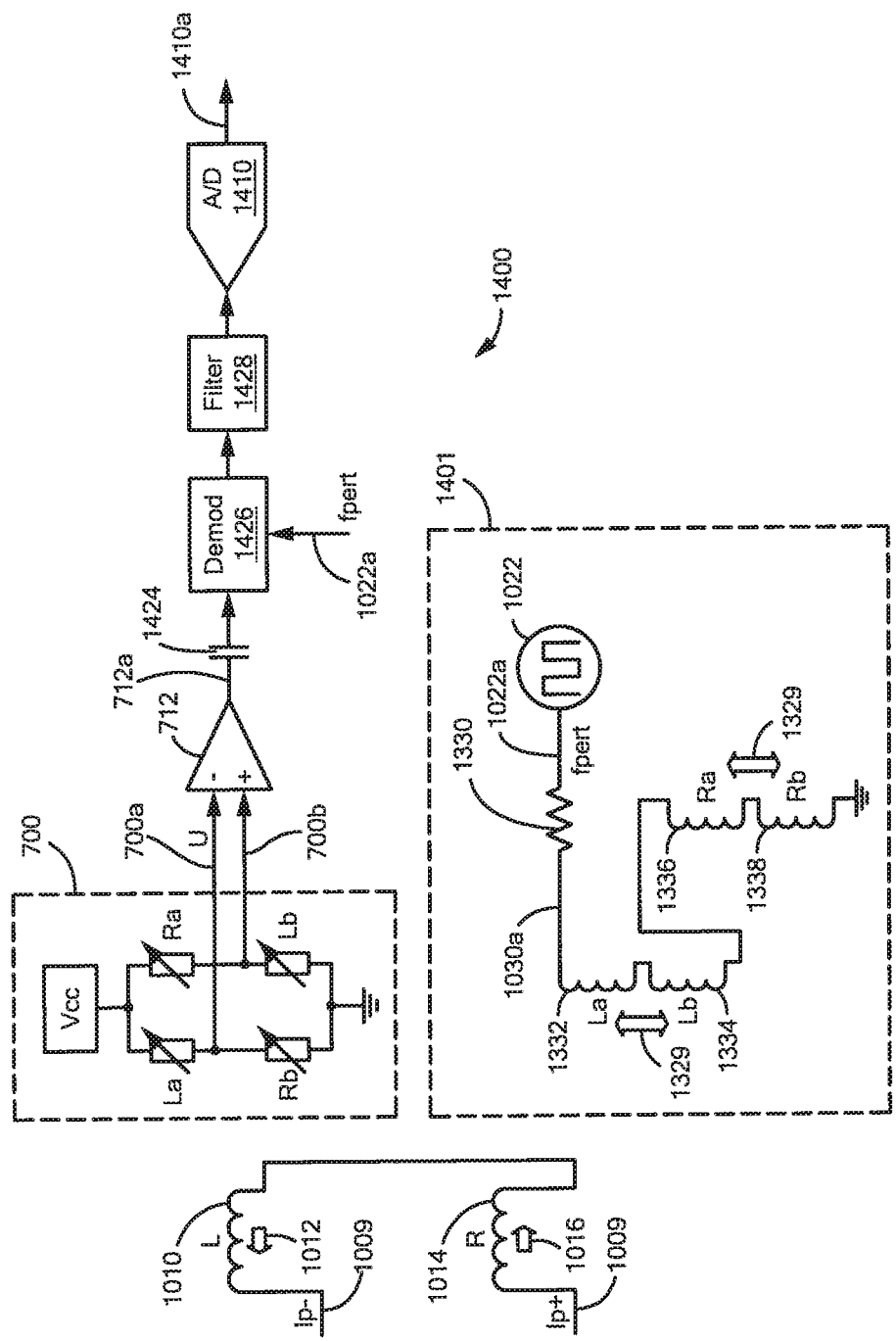
FIG. 14 is a schematic diagram of an illustrative current sensor having four TMR or GMR elements, arranged in one full bridge, and the two different amplitude detector circuits of FIG. 12 and with a non-feedback arrangement.

Referring now to FIG. 1400, in which like elements of FIGS. 7, 10, and 13 are shown having like reference designations, another illustrative magnetic field sensor 1400 can have many characteristics that are similar to the magnetic field sensors 1000, 1200, and 1300 of FIGS. 10, 12, and 14.

The magnetic field sensor 1400 can include four magnetoresistance elements coupled together in a full bridge arrangement 700, which can be the same as or similar to the full bridge arrangement 700 of FIG. 7.

First and second magnetoresistance elements, La, Lb can both be disposed proximate to each other and on the left side, for example, on the left side of the current conductor 502 of FIG. 5. Third and fourth magnetoresistance elements Ra, Rb can both be disposed proximate to each other and on the right side, for example, on the right side of the current conductor 502 of FIG. 5.

The first perturbing coil 1332 can be disposed proximate to the first magnetoresistance element, La, the second perturbing coil 1334 can be disposed proximate to the second magnetoresistance element, Lb, the third perturbing coil 1336 can be disposed proximate to the third magnetoresistance element, Ra, and the fourth perturbing coil 1338 can be disposed proximate to the fourth magnetoresistance element, Rb.

Taken together the first, second, third, and fourth perturbing coils 1332, 1334, 1336, 1338 along with the clock signal generator 1022 and the resistor 1330 are referred to herein as a perturbing magnetic field signal generator 1401.

The difference signal 712a, like the difference signal 712a of FIG. 7, is already a signal that represents a difference of signals generated by magnetoresistance elements on the left and right sides, for example left and right sides of the current conductor 502 of FIG. 5. Thus, two circuit channels for left and right sides described in conjunction with magnetic field sensors of FIGS. 10, 11, 12, and 13, are not required.

The difference signal 712a can be received by a capacitor 1424, which can be coupled to a demodulator 1426, which can be coupled to a filter 1428, which can be coupled to an analog-to-digital converter 1410 to generate a digital signal 1410a. The demodulator 1426 and the filter 1428 form an amplitude detecting circuit as described above in conjunction with FIG. 12.

Values of the digital signal 1410a can be indicative of values of the sensed current signal 1009.

Figure 15:
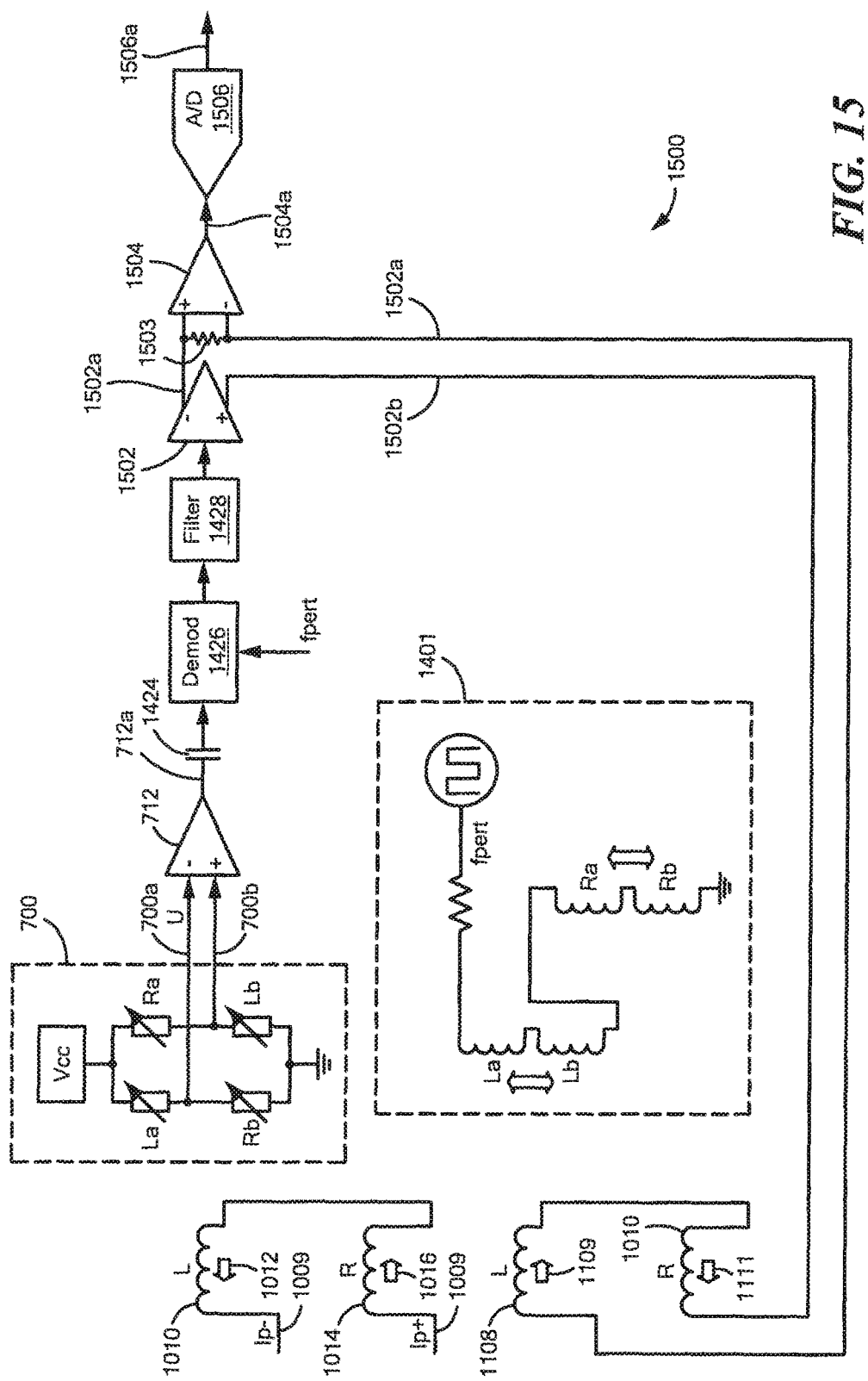
FIG. 15 is a schematic diagram of an illustrative current sensor having four TMR or GMR elements, arranged in one full bridge, and the two different amplitude detector circuits of FIG. 12 and with a feedback arrangement.

Referring now to FIG. 15, in which like elements of FIGS. 7, 10, 11, and 14 are shown having like reference designations a magnetic field sensor 1500 can be similar to the magnetic field sensor 1400 and FIG. 14 but also having a feedback arrangement of magnetic field sensor 1100 of FIG. 11.

Thus, the magnetic field sensor 1500 also can include a current driver 1502 coupled to the filter 1428 and operable to generate differential feedback current signal 1502a, 1502b received by the first and second feedback coils 1108, 1110 described above in conjunction with FIG. 11.

The magnetic field sensor 1500 can also include a resistor 1503 in series with one side of the differential current signal 1502a, 1502b. A voltage appears across the resistor 1503 with a value in accordance with the differential current signal 1502a, 1502b. A differential amplifier 1504 can be coupled to the resistor 1503. The differential amplifier 1506 can be operable to generate a signal 1504a, values of which can be indicative of the sensed current signal 1009. The signal 1504a can be coupled to an analog-to-digital converter 1506 can be operable to generate a digital signal 1506a, which can also be indicative of the sensed current signal 1009.

All references cited herein are hereby incorporated herein by reference in their entirety.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

Elements of embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A magnetic field sensor, comprising:
a first magnetoresistance element having a first maximum response axis and having a first pinning layer with a first magnetic direction perpendicular to the first maximum response axis;
a second magnetoresistance element having a second maximum response axis parallel to the first maximum response axis and having a second pinning layer with a second magnetic direction perpendicular to the second maximum response axis;
a first magnetic field generator disposed proximate to the first magnetoresistance element, the first magnetic field generator configured to generate a first AC magnetic field experienced by the first magnetoresistance element and parallel to the first maximum response axis; and
a second magnetic field generator disposed proximate to the second magnetoresistance element, the second magnetic field generator configured to generate a second AC magnetic field experienced by the second magnetoresistance element and parallel to the second maximum response axis,
wherein the magnetic field sensor is responsive to a sensed current passing through a current conductor, the current conductor comprising:
a first current conductor portion disposed proximate to the first magnetoresistance element; and
a second current conductor portion disposed proximate to the second magnetoresistance element, wherein the first current conductor portion is configured to generate a first current conductor magnetic field experienced by the first magnetoresistance element in response to the sensed current passing through the current conductor, wherein the second current conductor portion is configured to generate a second current conductor magnetic field experienced by the second magnetoresistance element in response to the sensed current passing through the current conductor, wherein the first current conductor magnetic field is perpendicular to the first maximum response axis, and wherein the second current conductor magnetic field is perpendicular to the second maximum response axis.

2. The magnetic field sensor of claim 1, further comprising:
a substrate holding the first magnetoresistance element, the second magnetoresistance element, the first magnetic field generator, and the second magnetic field generator; and
a lead frame having a plurality of leads, wherein the current conductor forms a current path between two of the plurality of leads.

3. The magnetic field sensor of claim 2, wherein the current conductor comprises an open loop such that the current flows in a first direction at a first one of the two of the plurality of leads and flows in a second direction different than the first direction at a second different one of the two of the plurality of leads.

4. The magnetic field sensor of claim 1, wherein the first magnetoresistance element comprises a first TMR element and the second magnetoresistance element comprises a second TMR element.

5. The magnetic field sensor of claim 1, further comprising:
a first amplitude detecting circuit operable to detect a first amplitude of a first signal generated in response to the first magnetoresistance element;
a second amplitude detecting circuit operable to detect a second amplitude of a second signal generated in response to the second magnetoresistance element; and
a differencing circuit operable to generate a difference of the first and second amplitudes.

6. The magnetic field sensor of claim 5, wherein the difference is indicative of an amplitude and a direction of the sensed current.

7. The magnetic field sensor of claim 5, wherein the first amplitude detecting circuit comprises a first rectifier circuit coupled to a first filter and wherein the second amplitude detecting circuit comprises a second rectifier circuit coupled to a second filter.

8. The magnetic field sensor of claim 5, wherein the first amplitude detecting circuit comprises a first demodulator and wherein the second amplitude detecting circuit comprises a second demodulator.

9. The magnetic field sensor of claim 1, further comprising:
a third magneto resistance element having a third maximum response axis and having a third pinning layer with a third magnetic direction perpendicular to the third maximum response axis;
a fourth magnetoresistance element having a fourth maximum response axis and having a fourth pinning layer with a fourth magnetic direction perpendicular to the fourth maximum response axis.

10. The magnetic field sensor of claim 9, further comprising:
a third magnetic field generator disposed proximate to the third magnetoresistance element, the third magnetic field generator configured to generate an AC magnetic field experienced by the third magnetoresistance element and parallel to the third maximum response axis; and
a fourth magnetic field generator disposed proximate to the fourth magnetoresistance element, the fourth magnetic field generator configured to generate a fourth AC magnetic field experienced by the fourth magnetoresistance element and parallel to the fourth maximum response axis.

11. The magnetic field sensor of claim 10, wherein the current conductor further comprises:
a third current conductor portion disposed proximate to the third magnetoresistance element; and
a fourth current conductor portion disposed proximate to the fourth magnetoresistance element, wherein the third current conductor portion is configured to generate a third current conductor magnetic field experienced by the third magnetoresistance element in response to a sensed current passing through the current conductor, wherein the fourth current conductor portion is configured to generate a fourth current conductor magnetic field experienced by the fourth magnetoresistance element in response to a sensed current passing through the current conductor, wherein the third current conductor magnetic field is parallel to the third magnetic direction of the third pinning layer, and wherein the fourth current conductor magnetic field parallel to the fourth magnetic direction of the fourth pinning layer.

12. The magnetic field sensor of claim 9, wherein the first magnetoresistance element and the second magnetoresistance element are coupled in a first full bridge with first and second fixed resistors, and wherein the third and fourth magnetoresistance elements are coupled in a second full bridge with third and fourth fixed resistors.

13. The magnetic field sensor of claim 12, wherein the first magnetoresistance element comprises a first TMR element, the second magnetoresistance element comprises a second TMR element, the third magnetoresistance element comprises a third TMR element and the fourth magnetoresistance element comprises a fourth TMR element.

14. The magnetic field sensor of claim 12, further comprising:
a first amplitude detecting circuit operable to detect a first amplitude of a first signal generated in response to the first full bridge;
a second amplitude detecting circuit operable to detect a second amplitude of a second signal generated in response to the second full bridge; and
a differencing circuit operable to generate a difference of the first and second amplitudes,
wherein the difference is indicative of an amplitude and a direction of the current.

15. The magnetic field sensor of claim 9, wherein the first, second, third and fourth magnetoresistance elements are coupled together in a full bridge.

16. The magnetic field sensor of claim 15, wherein the first magnetoresistance element comprises a first TMR element, the second magnetoresistance element comprises a second TMR element, the third magnetoresistance element comprises a third TMR element and the fourth magnetoresistance element comprises a fourth TMR element.

17. The magnetic field sensor of claim 15, further comprising:
an amplitude detecting circuit operable to detect an amplitude of a signal generated in response to the full bridge.

18. The magnetic the magnetic field sensor of claim 9, further comprising:
a substrate holding the first magnetoresistance element, the second magnetoresistance element, the third magnetoresistance element, the fourth magnetoresistance element, the first magnetic field generator, the second magnetic field generator, the third magnetic field generator, and the fourth magnetic field generator; and
a lead frame having a plurality of leads, wherein the current conductor forms a current path between two of the plurality of leads.

19. The magnetic field sensor of claim 18, wherein the current conductor comprises an open loop such that the current flows in a first direction at a first one of the two of the plurality of leads and flows in a second direction different than the first direction at a second different one of the two of the plurality of leads.

20. A method of providing a magnetic field sensor, comprising:
generating a first AC magnetic field experienced by a first magnetoresistance element and parallel to a first maximum response axis, the first magnetoresistance element having the first maximum response axis and having a first pinning layer with a first magnetic direction perpendicular to the first maximum response axis;
generating a second AC magnetic field experienced by a second magnetoresistance element and parallel to a second maximum response axis, the second magnetoresistance element having the second maximum response axis parallel to the first maximum response axis and having a second pinning layer with a second magnetic direction perpendicular to the second maximum response axis;
generating a first current conductor magnetic field experienced by the first magnetoresistance element in response to a sensed current passing through a current conductor; and
generating a second current conductor magnetic field experienced by the second magnetoresistance element in response to the sensed current passing through the current conductor, wherein the first current conductor magnetic field is perpendicular to the first maximum response axis, and wherein the second current conductor magnetic field is perpendicular to the second maximum response axis.

21. A magnetic field sensor, comprising:
means for generating a first AC magnetic field experienced by a first magnetoresistance element and parallel to a first maximum response axis, the first magnetoresistance element having the first maximum response axis and having a first pinning layer with a first magnetic direction perpendicular to the first maximum response axis;

means for generating a second AC magnetic field experienced by a second magnetoresistance element and parallel to a second maximum response axis, the second magnetoresistance element having the second maximum response axis parallel to the first maximum response axis and having a second pinning layer with a second magnetic direction perpendicular to the second maximum response axis;

means for generating a first current conductor magnetic field experienced by the first magnetoresistance element in response to a sensed current passing through a current conductor; and means for generating a second current conductor magnetic field experienced by the second magnetoresistance element in response to the sensed current passing through the current conductor, wherein the first current conductor magnetic field is perpendicular to the first maximum response axis, and wherein the second current conductor magnetic field is perpendicular to the second maximum response axis.

* * * * *

UNITED STATES PATENT AND TRADEMARK OFFICE
CERTIFICATE OF CORRECTION

PATENT NO. : 10,509,058 B2
APPLICATION NO. : 15/869620
DATED : December 17, 2019
INVENTOR(S) : Bryan Cadugan et al.

It is certified that error appears in the above-identified patent and that said Letters Patent is hereby corrected as shown below:

In the Specification

Column 1, Line 47 delete "magnetoresistances" and replace with --magnetoresistance--.

Column 2, Line 12 delete "and" and replace with --an--.

Column 6, Line 57 delete "referring" and replace with --referred--.

Column 7, Line 28 delete "experience" and replace with --experienced--.

Column 7, Line 51 delete "referring" and replace with --referred--.

Column 9, Line 19 delete "and" and replace with --an--.

Column 9, Line 46 delete "element" and replace with --elements--.

Column 15, Line 11 delete "series" and replace with --in series--.

Column 15, Line 11 delete "points" and replace with --forms--.

Column 15, Line 21 delete "amplitude" and replace with --analog--.

Column 15, Line 22 delete "amplitude" and replace with --analog--.

Column 15, Line 52 delete "that" and replace with --than--.

Column 16, Line 52 delete "and" and replace with --an--.

Column 16, Line 55 delete "ty" and replace with --by--.

Signed and Sealed this
Eighth Day of September, 2020

Andrei Iancu
*Director of the United States Patent and Trademark Office*

Column 16, Line 64 delete "and" and replace with --an--.

Column 17, Line 12 delete "should be understood" and replace with --it should be understood--.

Column 17, Line 16 delete "Read how to" and replace with --Referring now to--.

Column 18, Line 16 delete "beast" and replace with --be--.

Column 18, Line 19 delete "beast" and replace with --be--.

Column 18, Line 30 delete "operational the" and replace with --operation of the--.

In the Claims

Column 21, Line 7 delete "magneto resistance" and replace with --magnetoresistance--.